US009169435B2

(12) United States Patent
Guo et al.

(10) Patent No.: US 9,169,435 B2
(45) Date of Patent: Oct. 27, 2015

(54) HIGHLY LUMINESCENT NANOSTRUCTURES AND METHODS OF PRODUCING SAME

(71) Applicant: NANOSYS, Inc., Milpitas, CA (US)

(72) Inventors: Wenzhuo Guo, Cupertino, CA (US); Jian Chen, Sunnyvale, CA (US); Robert Dubrow, San Carlos, CA (US); William P. Freeman, San Mateo, CA (US)

(73) Assignee: Nanosys, Inc., Milpitas, CA (US)

( * ) Notice: Subject to any disclaimer, the term of this patent is extended or adjusted under 35 U.S.C. 154(b) by 194 days.

(21) Appl. No.: 13/917,570

(22) Filed: Jun. 13, 2013

(65) Prior Publication Data
US 2014/0001405 A1 Jan. 2, 2014

Related U.S. Application Data

(60) Provisional application No. 61/667,147, filed on Jul. 2, 2012.

(51) Int. Cl.
  C09K 11/06 (2006.01)
  B82Y 40/00 (2011.01)
(52) U.S. Cl.
  CPC ............... C09K 11/06 (2013.01); B82Y 40/00 (2013.01); *Y10S 977/774* (2013.01); *Y10S 977/778* (2013.01); *Y10S 977/818* (2013.01); *Y10S 977/824* (2013.01); *Y10S 977/825* (2013.01); *Y10S 977/84* (2013.01)
(58) Field of Classification Search
  CPC .................................. C09K 11/06; B82Y 40/00
  See application file for complete search history.

(56) References Cited

U.S. PATENT DOCUMENTS

| 5,505,928 A | 4/1996 | Alivisatos et al. |
| 5,882,779 A | 3/1999 | Lawandy |
| 5,892,084 A | 4/1999 | Janeiro et al. |
| 5,958,591 A | 9/1999 | Budd |
| 5,985,173 A | 11/1999 | Gray et al. |
| 5,990,479 A | 11/1999 | Weiss et al. |
| 6,084,250 A | 7/2000 | Juestel et al. |
| 6,114,038 A | 9/2000 | Castro et al. |
| 6,147,363 A | 11/2000 | Udagawa |
| 6,153,123 A | 11/2000 | Hampden-Smith et al. |
| 6,179,912 B1 | 1/2001 | Barbera-Guillem et al. |
| 6,180,029 B1 | 1/2001 | Hampden-Smith et al. |
| 6,207,229 B1 | 3/2001 | Bawendi et al. |
| 6,207,392 B1 | 3/2001 | Weiss et al. |
| 6,225,198 B1 | 5/2001 | Alivisatos et al. |
| 6,251,303 B1 | 6/2001 | Bawendi et al. |
| 6,278,135 B1 | 8/2001 | Srivastava et al. |
| 6,294,800 B1 | 9/2001 | Duggal et al. |
| 6,306,610 B1 | 10/2001 | Bawendi et al. |
| 6,306,736 B1 | 10/2001 | Alivisatos et al. |
| 6,319,426 B1 | 11/2001 | Bawendi et al. |
| 6,322,901 B1 | 11/2001 | Bawendi et al. |
| 6,326,144 B1 | 12/2001 | Bawendi et al. |
| 6,344,520 B1 | 2/2002 | Greene |
| 6,353,073 B1 | 3/2002 | Biggs et al. |
| 6,423,551 B1 | 7/2002 | Weiss et al. |
| 6,426,513 B1 | 7/2002 | Bawendi et al. |
| 6,429,583 B1 | 8/2002 | Levinson et al. |
| 6,440,213 B1 | 8/2002 | Alivisatos et al. |
| 6,444,143 B2 | 9/2002 | Bawendi et al. |
| 6,468,808 B1 | 10/2002 | Nie et al. |
| 6,482,672 B1 | 11/2002 | Hoffman et al. |
| 6,501,091 B1 | 12/2002 | Bawendi et al. |
| 6,573,535 B2 | 6/2003 | Hori et al. |
| 6,576,291 B2 | 6/2003 | Bawendi et al. |
| 6,602,671 B1 | 8/2003 | Bawendi et al. |
| 6,607,829 B1 | 8/2003 | Bawendi et al. |
| 6,617,583 B1 | 9/2003 | Bawendi et al. |
| 6,660,281 B1 | 12/2003 | Nakanishi et al. |
| 6,682,596 B2 | 1/2004 | Zehnder et al. |
| 6,696,299 B1 | 2/2004 | Empedocles et al. |
| 6,699,723 B1 | 3/2004 | Weiss et al. |
| 6,711,426 B2 | 3/2004 | Benaron et al. |
| 6,713,586 B2 | 3/2004 | Greene |
| 6,727,065 B2 | 4/2004 | Weiss et al. |
| 6,734,465 B1 | 5/2004 | Taskar et al. |
| 6,774,361 B2 | 8/2004 | Bawendi et al. |

(Continued)

FOREIGN PATENT DOCUMENTS

| WO | WO-9927584 A1 | 6/1999 |
| WO | WO-03054953 A1 | 7/2003 |

(Continued)

OTHER PUBLICATIONS

U.S. Appl. No. 14/669,425, filed Mar. 26, 2015.*
U.S. Appl. No. 14/669,436, filed Mar. 26, 2015.*
Akcora, P., et al., "Structural and Magnetic Characterization of Norbornene-Deuterated Norbornene Dicarboxylic Acid Diblock Copolymers Doped with Iron Oxide Nanoparticles," Polymer 46(14):5194-5201, Elsevier Ltd, England (2005).
Alivisatos, A.P., "Semiconductor Clusters, Nanocrystals, and Quantum Dots," Science 271:933-937, American Association for the Advancement of Science, United States (1996).
Battaglia, D and Peng, X., "Formation of High Quality InP and InAs Nanocrystals in a Noncoordinating Solvent," Nano Letters 2(9):1027-1030, American Chemical Society, United States (2002).
Beachley, O.T. Jr., et al., "Chemistry of In(C5H5)3 and Some Heteroleptic Organoindium(III) Derivatives. Crystal and Molecular Structures of $In(C_5H_5)_3$, $(C_5H_5)_3In \cdot PPh_3$, and $(Me_3CCH_2)_2In(C_5H_5)$," Organometallics 21(22):4632-4640, American Chemical Society, United States (2002).

(Continued)

*Primary Examiner* — Carol M Koslow
(74) *Attorney, Agent, or Firm* — Sterne, Kessler, Goldstein & Fox P.L.L.C.

(57) ABSTRACT

Highly luminescent nanostructures, particularly highly luminescent quantum dots, are provided. The nanostructures have high photoluminescence quantum yields and in certain embodiments emit light at particular wavelengths and have a narrow size distribution. The nanostructures can comprise ligands, including C5-C8 carboxylic acid ligands employed during shell formation and/or dicarboxylic or polycarboxylic acid ligands provided after synthesis. Processes for producing such highly luminescent nanostructures are also provided, including methods for enriching nanostructure cores with indium and techniques for shell synthesis.

17 Claims, 3 Drawing Sheets

(56) References Cited

U.S. PATENT DOCUMENTS

| | | | |
|---|---|---|---|
| 6,781,166 B2 | 8/2004 | Lieber et al. |
| 6,783,855 B1 | 8/2004 | Dobson et al. |
| 6,788,453 B2 | 9/2004 | Banin et al. |
| 6,803,719 B1 | 10/2004 | Miller et al. |
| 6,815,064 B2 | 11/2004 | Treadway et al. |
| 6,819,692 B2 | 11/2004 | Klimov et al. |
| 6,821,337 B2 | 11/2004 | Bawendi et al. |
| 6,855,202 B2 | 2/2005 | Alivisatos et al. |
| 6,855,551 B2 | 2/2005 | Bawendi et al. |
| 6,861,155 B2 | 3/2005 | Bawendi et al. |
| 6,864,626 B1 | 3/2005 | Weiss et al. |
| 6,870,311 B2 | 3/2005 | Mueller et al. |
| 6,884,478 B2 | 4/2005 | Alivisatos et al. |
| 6,890,777 B2 | 5/2005 | Bawendi et al. |
| 6,914,265 B2 | 7/2005 | Bawendi et al. |
| 6,918,946 B2 | 7/2005 | Korgel et al. |
| 6,921,496 B2 | 7/2005 | Anderson et al. |
| 6,927,069 B2 | 8/2005 | Weiss et al. |
| 6,933,535 B2 | 8/2005 | Steigerwald et al. |
| 6,949,206 B2 | 9/2005 | Whiteford et al. |
| 6,984,369 B1 | 1/2006 | Alivisatos et al. |
| 7,049,148 B2 | 5/2006 | Bawendi et al. |
| 7,060,243 B2 | 6/2006 | Bawendi et al. |
| 7,068,898 B2 | 6/2006 | Buretea et al. |
| 7,091,656 B2 | 8/2006 | Murazaki et al. |
| 7,125,605 B2 | 10/2006 | Bawendi et al. |
| 7,138,098 B2 | 11/2006 | Bawendi et al. |
| 7,175,778 B1 | 2/2007 | Bhargava et al. |
| 7,267,875 B2 | 9/2007 | Whiteford et al. |
| 7,326,908 B2 | 2/2008 | Sargent et al. |
| 7,332,701 B2 | 2/2008 | Van Arendonk et al. |
| 7,374,807 B2 | 5/2008 | Parce et al. |
| 7,374,824 B2 | 5/2008 | Bawendi et al. |
| 7,432,642 B2 | 10/2008 | Murazaki |
| 7,557,028 B1 | 7/2009 | Scher et al. |
| 7,566,476 B2 | 7/2009 | Bawendi et al. |
| 7,585,564 B2 | 9/2009 | Whiteford et al. |
| 7,598,314 B2 | 10/2009 | Lee et al. |
| 7,645,397 B2 | 1/2010 | Parce et al. |
| 7,834,121 B2 | 11/2010 | Mowrer et al. |
| 8,062,967 B1 | 11/2011 | Scher et al. |
| 8,071,079 B2 | 12/2011 | Decaire et al. |
| 8,101,234 B2 | 1/2012 | Bawendi et al. |
| 8,158,193 B2 | 4/2012 | Bawendi et al. |
| 2002/0066401 A1 | 6/2002 | Peng et al. |
| 2002/0071952 A1 | 6/2002 | Bawendi et al. |
| 2002/0105004 A1 | 8/2002 | Hori et al. |
| 2002/0130311 A1 | 9/2002 | Lieber et al. |
| 2003/0010987 A1 | 1/2003 | Banin et al. |
| 2003/0066998 A1 | 4/2003 | Lee |
| 2003/0142944 A1 | 7/2003 | Sundar et al. |
| 2003/0145779 A1 | 8/2003 | Alivisatos et al. |
| 2003/0175004 A1 | 9/2003 | Garito et al. |
| 2003/0185771 A1 | 10/2003 | Kamei et al. |
| 2003/0214699 A1 | 11/2003 | Banin et al. |
| 2003/0226498 A1 | 12/2003 | Alivisatos et al. |
| 2004/0004982 A1 | 1/2004 | Eisler et al. |
| 2004/0007169 A1 | 1/2004 | Ohtsu et al. |
| 2004/0017834 A1 | 1/2004 | Sundar et al. |
| 2004/0023010 A1 | 2/2004 | Bulovic et al. |
| 2004/0033270 A1 | 2/2004 | Kropf et al. |
| 2004/0178390 A1 | 9/2004 | Whiteford et al. |
| 2004/0245912 A1 | 12/2004 | Thurk et al. |
| 2005/0161666 A1 | 7/2005 | Park et al. |
| 2005/0179364 A1 | 8/2005 | Murazaki |
| 2005/0234416 A1 | 10/2005 | Kropf et al. |
| 2006/0001119 A1 | 1/2006 | Liu et al. |
| 2006/0040103 A1 | 2/2006 | Whiteford et al. |
| 2006/0060862 A1 | 3/2006 | Bawendi et al. |
| 2006/0068154 A1 | 3/2006 | Parce et al. |
| 2006/0110279 A1 | 5/2006 | Han et al. |
| 2006/0157686 A1 | 7/2006 | Jang et al. |
| 2007/0034833 A1 | 2/2007 | Parce et al. |
| 2007/0112101 A1 | 5/2007 | Choi et al. |
| 2007/0185261 A1 | 8/2007 | Lee et al. |
| 2007/0213492 A1 | 9/2007 | Mowrer et al. |
| 2008/0090947 A1 | 4/2008 | Shin et al. |
| 2008/0118755 A1 | 5/2008 | Whiteford et al. |
| 2008/0237540 A1 | 10/2008 | Dubrow |
| 2010/0006005 A1 | 1/2010 | Roesch et al. |
| 2010/0052512 A1 | 3/2010 | Clough et al. |
| 2010/0110728 A1 | 5/2010 | Dubrow et al. |
| 2010/0113813 A1 * | 5/2010 | Pickett et al. .................. 556/9 |
| 2010/0140551 A1 | 6/2010 | Parce et al. |
| 2010/0155749 A1 | 6/2010 | Chen et al. |
| 2010/0276638 A1 | 11/2010 | Liu et al. |
| 2010/0278770 A1 | 11/2010 | Arditty et al. |
| 2011/0189102 A1 | 8/2011 | Kairdolf et al. |
| 2011/0262752 A1 | 10/2011 | Bawendi et al. |
| 2011/0263062 A1 | 10/2011 | Bawendi et al. |
| 2012/0068118 A1 | 3/2012 | Parce et al. |
| 2012/0113672 A1 | 5/2012 | Dubrow et al. |
| 2013/0181603 A1 | 7/2013 | Dubrow et al. |
| 2013/0196460 A1 | 8/2013 | Dubrow et al. |
| 2013/0345458 A1 | 12/2013 | Freeman et al. |
| 2014/0009964 A1 | 1/2014 | Dubrow et al. |

FOREIGN PATENT DOCUMENTS

| | | | |
|---|---|---|---|
| WO | WO-03092081 A1 | | 11/2003 |
| WO | WO-2005022120 A2 | | 3/2005 |
| WO | WO-2005023923 A2 | | 3/2005 |
| WO | WO-2008013780 A2 | | 1/2008 |
| WO | WO 2010/003059 | * | 1/2010 |
| WO | WO 2010/060131 | * | 6/2010 |
| WO | WO-2011092647 A2 | | 8/2011 |

OTHER PUBLICATIONS

Beachley, O.T. Jr., et al., "Reagents based on Cyclopentadienyl Derivatives of the Group 14 elements for the Synthesis of Indium(I) derivatives. Crystal and Molecular Structure of In($C_5H_4SiMe_3$)," Organometallics 9(9):2488-2492, American Chemical Society, United States (1990).

Beletskaya, I.P., et al., "New Approach to Phosphinoalkynes based on Pd- and Ni-Catalyzed Cross-Coupling of Terminal Alkynes with Chlorophosphanes," Organic letters 5(23):4309-4311, American Chemical Society, United States (2003).

Bharali, D.J., et al., "Folate-Receptor-Medicated Delivery of InP Quantum Dots for Bioimaging using Confocal and Two-Photon Microscopy," Journal of American Chemical Society 127(32):11367-11371, American Chemical Society, United States (2005).

Boeckman, R.K. Jr., et al., "Cyclic Vinyl Ether Carbanions I: Synthetic Equivalents of β-Acylvinyl and Substituted Acyl anions," Tetahedron Letter 18(48):4187-4190, Pergamon Press, Great Britain (1977).

Boeckman, R.K. Jr., et al., "Cyclic vinyl Ether Carbanions—II : Preparation and Applications to the Synthesis of Carbonyl Compounds," Tetrahedron 37(23):3997-4006, Pergamon Press, Great Britain (1981).

Borchert, H., et al., "Investigation of ZnS Passivated InP Nanocrystals by XPS," Nano Letters 2(2):151-154, American Chemical Society, United States (2002).

Bradley, D.C., et al., "Pentanuclear Oxoalkoxide Clusters of Scandium, Yttrium, Indium and Ytterbium, X-Ray Crystal Structures of [$M_5(\mu_5\text{-}O)(\mu_3\text{-}OPr^i)_4(\mu_2\text{-}OPr^i)_4(OPr^i)_5$] (M=In, Yb)," Polyhedron 9(5):719-726, Pergamon Press PLC, Great Britain (1990).

Bradley, et al., "A Penta-Indium Oxo Alkoxide Cluster with a Central 5-Co-Ordinate Oxygen, Preparation and x-Ray Crystl Structure of ($InOPr^i)_5(\mu_2\text{-}OPr^i)_4(\mu_3\text{-}OPr^i)_4(\mu_5\text{-}O$)," Journal of the Chemical Society, Chemical Communications 18:1258-1259, The Royal Society of Chemistry, England (1988).

Bollen C. and Mulvaney P., "The Effects of Chemisorption on the Luminescence of CdSe Quantum Dots," Langmuir 22(7):3007-3013, American Chemical Society, United States (2006).

Cao, L., et al., "Luminescence enhancement of core-shell ZnS: Mn/ZnS nanoparticles," Applied Physical Letters 80(23):4300-4302, American Institute of Physics, United States (2002).

Cao, Y.W., et al., "Colloidal synthesis and properties of InAs/InP and InAs/CdSe core/shell nanocrystals," Materials Research Society Symposia Proceedings 571:75-80, Materials Research Society, United States (2000).

(56) References Cited

OTHER PUBLICATIONS

Cao, YW., et al., "Growth and Properties of Semiconductor Core/Shell Nanocrystals with InAs Cores," Journal of American Chemical Society 122:9692-9702, American Chemical Society, United States (2000).

Chen, H-S, et al., "Colloidal ZnSe, ZnSe/ZnS, and ZnSe/ZnSeS Quantum Dots Synthesized from ZnO," Journal of Physical Chemistry B 108(44):17119-17123, American Chemical Society, United States (2004).

Clay, R.T. and Cohen, R.E., "Synthesis of Cu and CuO Nanoclusters within Microphase-Separated Diblock Copolymers," New Journal of Chemistry 22(7):745-748, Royal Society of Chemistry, Great Britain (1998).

Clay, R.T. and Cohen, R.E., "Synthesis of Metal Nanoclusters within Microphase-Separated Diblock Copolymers: ICP-AES Analysis of Metal Ion Uptake," Supramolecular Science 4(1-2):113-119, Elsevier Ltd, Great Britain (1997).

Cros-Gagneux, A., et al., "Surface Chemistry of InP Quantum Dots: A Comprehensive Study," Journal of the American Chemical Society 132(51):18147-18157, American Chemical Society, United States (2010).

Dabbousi, B.O., et al., "(CdSe)ZnS Core-Shell Quantum Dots: Synthesis and Characterization of a Size Series of Highly Luminescent Nanocrystallites," Journal of Physical Chemistry B 101:9463-9475, American Chemical Society, United States (1997).

Ebenstein, Y., et al., "Fluorescence Quantum Yield of CdSe/ZnS Nanocrystals Investigated by Correlated Atomic-force and Single-particle fluorescence microscopy," Applied Physical Letters 80(21):4033-4035, American Institute of Physics, United States (2002).

Farina, V., et al., "Large Rate Accelerations in the Stille Reaction with Tri-2-Furylphosphine and Triphenylarsine as Palladium Ligands: Mechanistic and Synthetic Implications," Journal of the American Chemical Society 113:9585-9595, American Chemical Society, United States (1991).

Franks, S., et al., "The Preparation and Properties of Tertiary Phosphines and Tertiary Phosphine Oxides with Long Alkyl Chains," Journal of the Chemical Society, Perkin Transactions 1(1):3029-3033, Royal Society of Chemistry, Great Britain (1979).

"Reactive silicones: forging new polymer links," Gelest, Inc.: 26-33 Gelest, Inc. Catalog, United States (2004).

Guzelian, A. A., et al., "Synthesis of Size-Selected, Surface-Passivated InP Nanocrystals," The Journal of Physical Chemistry 100(17):7212-7219, American Chemical Society, United States (1996).

Guzelian, A.A., et al., "Colloidal Chemical Synthesis and Characterization of InAs Nanocrystal Quantum Dots," Applied Physics Letters 69(10):1432-1434, American Institute of Physics, United States (1996).

Haubold, S., et al., "Strongly Luminescent InP/ZnS Core-Shell Nanoparticles," Chemphyschem 2(5):331-334, Wiley-VCH-Verlag GmbH, Germany (2001).

Hines, M.A., et al., "Bright UV-blue Luminescent Colloidal ZnSe Nanocrystals," Journal of Physical Chemistry B 102(19):3655-3657, American Chemical Society, United States (1998).

Hirai, T., et al., "Composite Nano-CdS-Polyurethane Transparent Films," Journal of Materials Chemistry 9:1217-1219, Royal Society of Chemistry, England (1999).

Hirai, T., et al., "Effects of thiols on photocatlytic properties of nano-CdS-polythiourethane composite particles," Journal of Chemical Engineering Japan 31(6):1003-1006, The Society of Chemical Engineers, Japan (1998).

Hirai, T., and Komasawa, I., "Preparation of Nano-CdS-Polyurethane Composites via in Situ Polymerization in Reverse Micellar Systems," Journal of Materials Chemistry 10:2234-2235, The Royal Society of Chemistry, England (2000).

Hirai, T., et al., "Preparation of semiconductor nanoparticles polyurea composites using reverse micellar systems via an in situ diisocyanate polymerization," Journal of Physical Chemistry B 103(46):10120-10126, American Chemical Society, United States (1999).

Hussain, S., et al., "One-Pot Fabrication of High-Quality InP/ZnS (Core/Shell) Quantum Dots and their Application to Cellular Imaging," Chemphyschem 10(9-10):1466-1470, Wiley-VCH Verlag GmbH & Co. KGaA, Germany (2009).

Ji, H.L., et al., "Scope and Diastereoselectivity of Intramolecular [4+2] Diels-Alder Cycloadditions within the Coordination Sphere of $[(\eta^5\text{-}C_5H_5)Ru(DMPP)_{3-n}(\text{dienophile})_n]PF_6$," Organometallics 11:1840-1855, Wiley-VCH Verlag GmbH & Co., Germany (1992).

Kane, R.S. and Cohen, R.E., "Synthesis of Doped ZnS Nanoclusters within Block Copolymer Nanoreactors," Chemistry of Materials 11(1):90-93, American Chemical Society, United States (1999).

Kim, S., et al., "Highly Luminescent InP/GaP/ZnS Nanocrystals and their Application to White Light-Emitting Diodes," Journal of the American Chemical Society 134(8):3804-3809, American Chemical Society, United States (2012).

Korgel, B.A. and Monbouquette, H.G., "Controlled Synthesis of Mixed Core and Layered (Zn,Cd)S and (Hg,Cd)S Nanocrystals within Phosphatidylcholine Vesicles," Langmuir 16(8):3588-3594, American Chemical Society, United States (2000).

Kost, D., et al., "The Barrier to Carbon—Phosphorus Bond Rotation in Tribenzoylphosphine. An Experimental Reinvestigation," Tetrahedron Letter 20(22)1983-1986, Pergamon Press Ltd, Great Britain (1979).

Kyprianidou-Leodidou, T., et al., "Size Variation of PbS Particles in High-Refractive-Index Nanocomposites," Journal of Physical Chemistry 98(36):8992-8997, American Chemical Society, United States (1994).

Lee, J., et al., "Full Color Emission from II-VI Semiconductor Quantum Dot-Polymer Composites," Advanced Materials 12(15):1102-1105, Wiley-VCH Verlag GmbH, Germany (2000).

Lehmann, U., et al., "Palladium-Catalyzed Cross-Coupling Reactions Between Dihydropyranylindium Reagents and Aryl Halides. Synthesis of C-Aryl Glycals," Organic letters 5(14):2405-2408, American Chemical Society, United States (2003).

Li, S.L., et al., "High Quality ZnSe and ZnS Nanocrystals Formed by activating zinc carboxylate precursors," Nano Letters 4(11):2261-2264, American Chemical Society, United States (2004).

Li, Y., et al., "White-Light-Emitting Diodes Using Semiconductor Nanocrystals," Microchimica Acta 159:207-215, Springer-Verlag, Netherlands (2007).

Li, L., et al., "Economic Synthesis of High Quality InP Nanocrystals Using Calcium Phosphide as the Phosphorus Precursor," Chemistry of Materials 20(8):2621-2623, American Chemical Society, United States (2008).

Li, L., et al., "One-Pot Synthesis of Highly Luminescent InP/ZnS Nanocrystals without Precursor Injection," Journal of the American Chemical Society 130(35):11588-11589, American Chemical Society, United States (2008).

Lim, J., et al., "InP@ZnSeS, Core@Composition Gradient Shell Quantum Dots with Enhanced Stability," Chemistry of Materials 23(20):4459-4463, American Chemical Society, United States (2011).

Liu, Z., et al., "Coreduction Colloidal Synthesis of III-V Nanocrystals: The Case of InP," Angewandte Chemie 47(19):3540-3542, Wiley-VCH Verlag GmbH, Germany (2008).

Lu, C., et al., "High Refractive Index Thin Films of ZnS/polythiourethane Nanocomposites," Journal of Materials Chemistry 13:526-530, The Royal Society of Chemistry, England (2003).

Lucey, D.W, et al., "Monodispersed InP Quantum Dots Prepared by Colloidal Chemistry in a Noncoordinating Solvent," Chemistry of Materials 17(14):3754-3762, American Chemical Society, United States (2005).

MacDonell, G.D., et al., "The Barrier to Carbon—phosphorus Bond Rotation in Triaroylphosphines," Tetrahedron Letters 10:857-860, Pergamon Press, Great Britain (1978).

Malik, M.A., et al., "Synthesis and Characterization of Mn doped CdS Quantum Dots from a Single Source Precursor ," Materials Research Society Symposia Proceedings 581:133-138, Materials Research Society, United States (2000).

(56) References Cited

OTHER PUBLICATIONS

Malik, M.A., et al., "Synthesis and Characterization of CdSe/CdS Core-Shell and CdSe/CdS Composites," Materials Research Society Symposia Proceedings 581:291-296, Materials Research Society, United States (2000).
Manna, L., et al., "Shape Control of Colloidal Semiconductor Nanocrystals," Journal of Cluster Science 13(4):521-532, Plenum Publishing Corporation, United States (2002).
Mews, A., et al., "Structural and Spectroscopic Investigations of CdS/HgS/CdS Quantum-Dot Quantum Wells," Physical Review B 53(20):R13242-R13245, The American Physical Society, United States (1996).
Mews, A., et al., "Preparation, Characterization and Photophysics of the Quantum Dot Quantum Well System CdS/HgS/ CdS," Journal of Physical Chemistry 98(3):934-941, American Chemical Society, United States (1994).
Micic, O.I., et al., "Core-Shell Quantum Dots of Lattice-Matched ZnCdSe2 Shells on InP Cores: Experiment and Theory," Journal of Physical Chemistry 104(51):12149-12156, American Chemical Society, United States (2000).
Micic, O.I., et al., "Size-Dependent Spectroscopy of InP Quantum Dots," Journal of Physical Chemistry 101(25):4904-4912, American Chemical Society, United States (1997).
Micic, O.I., et al., "Synthesis and Characterization of InP, GaP, and GaInP2 Quantum Dots," Journal of Physical Chemistry 99(19):7754-7759, American Chemical Society, United States (1995).
Miinea, L.A., et al., "Indium Fluoroalkoxide Compounds," Inorganic chemistry 38(20):4447-4454, American Chemical Society, United States (1999).
Mulligan, R.F., et al., "Synthesis and Characterization of ZnO Nanostructures Templates Using Diblock Copolymers," Journal of Applied Polymer Science 89(4):1058-1061, Wiley Periodicals, Inc., United States (2003).
Mulligan, R.F. et al, "Synthesis of Self-assembled Metal-oxide Nanostructures in Diblock Copolymer Matrix and Integration onto Semiconductor Surfaces," Materials Research Society Symposia Proceedings 642:J2.11.1-J2.11.5, Materials Research Society, United States (2001).
Murray, C.B., et al., "Synthesis and Characterization of nearly Monodisperse CdE (E=Sulfur, Selenium, Tellurium) Semiconductor Nanocrystallites," Journal of the American Chemical Society 115(19):8706-8715, American Chemical Society, United States (1993).
Nann, T., et al., "Water Splitting by Visible Light: A Nanophotocathode for Hydrogen Production," Angewandte Chemie 49(9):1574-1577, Wiley-VCH Verlag GmbH & Co, Germany (2010).
Ogata, S., et al., "New Preparation Method for Organic-Inorganic Layered Compounds by Organa Derivatization Reaction," Journal of Material Chemistry 10(2):321-327, Royal Society of Chemistry, England (2000).
Peng, X., et al., "Epitaxial Growth of Highly Luminescent CdSe/CdS Core/Shell Nanocrystals with Photostability and Electronic Accessibility," Journal of the American Chemical Society 119(30):7019-7029, American Chemical Society, United States (1997).
Peng, X., et al., "Shape Control of CdSe Nanocrystals," Nature 404(6773):59-61, Nature Publishing Group, England (2000).
Puntes, V.F., et al., "Colloidal Nanocrystal Shape and Size Control: the Case of Cobalt," Science 291:2115-2117, American Association for the Advancement of Science, United States (2001).
Qi, L.M., et al., "Synthesis and Characterization of Mixed CdS—ZnS Nanoparticles in Reverse Micelles," Colloids and Surfaces 111(3):195-202, Elsevier Science B.V., Netherlands (1996).

Reid, E.E., et al., "Organic Chemistry of Bivalent Sulfur," 1:33, Chemical Publishing Co., Inc., United States (1958).
Rhys Williams, A.T., et al., "Relative Fluorescence Quantum Yields Using a Computer-Controlled Luminescence Spectrometer," Analyst 108(1290):1067-1071, Royal Society of Chemistry, England (1983).
Robinson, H.D., et al., "Lateral Coupling of Self-Assembled Quantum Dots Studied by Near-field Spectroscopy," Materials Research Society Symposia Proceedings 571:89-94, Materials Research Society, United States (2000).
Schiefer, M., et al., "Neutral and Ionic Aluminum, Gallium, and Indium Compounds Carrying two or three Terminal Ethynyl groups," Inorganic chemistry 42(16):4970-4976, American Chemical Society, United States (2003).
Shiojiri, S., et al., "Immobilization of Semiconductor Nanoparticles Formed in Reverse Micelles into Polyurea via in Situ Polymerization of Diisocyanates," Chemical Communications 1439-1440, Royal Society of Chemistry, United Kingdom (1998).
Shiojiri, S., et al., "Thiol-Mediated Immobilization of Photocatalytic Metal Sulfide Ultrafine Particles Formed in Reverse Micellar Systems in Polythiourethane," Journal of Chemical Engineering of Japan 31(3):425-433, The Society of Chemical Engineers, Japan (1998).
Smith, A. and Nie, S., "Minimizing the Hydrodynamic Size of Quantum Dots with Multifunctional Multidentate Polymer Ligands," Journal of the American Chemical Society 130(34):11278-11279, American Chemical Society, Untied States (2008).
Sohn, B.H. and Cohen R.E., "Processible Optically Transparent Block Copolymer Films Containing Superparamagnetic Iron Oxide Nanoclusters," Chemistry of Materials 9(1):264-269, American Chemical Society, Untied States (1997).
Son, S.U., et al., "Facile Synthesis of Various Phosphine-Stabilized Monodisperse Palladium Nanoparticles through the Understanding of Coordination Chemistry of the Nanoparticles," Nano Letters 4(6):1147-1151, American Chemical Society, United States (2004).
Talapin, D.V., et al., "Etching of Colloidal InP Nanocrystals with Fluorides: Photochemical Nature of the Process Resulting in High Photoluminescence Efficiency," Journal of Physical Chemistry B 106(49):12659-12663, American Chemical Society, United States (2002).
Technical Data Sheet for ZnO: Ultrafine Powder-350 from Sumitomo Osaka Cement Co. Ltd. (1995), Retrieved from http://www.socnb.corn/product/hproduct_e/ad_zno_e.html.
Tolbert, S.H. and Alivisatos, A.P., "High-Pressure Structural Transformations in Semiconductor Nanocrystals," Annual Review of Physical Chemistry 46:595-626, Annual Reviews, United States (1995).
Wells, R.L., et al., "Use of Tris(trimethylsilyl)Arsine to Prepare Gallium Arsenide and Indium Arsenide," Chemistry of Materials 1(1):4-6, American Chemical Society, United States (1989).
Xie, R., et al., "Colloidal InP Nanocrystals as Efficient Emitters Covering Blue to Near-Infrared," Journal of the American Chemical Society 129(50):15432-15433, American Chemical Society, United States (2007).
Xu, L., et al., "Reduced Photo-Instability of luminescence Spectrum of Core-Shell CdSe/CdS Nanocrystals," Journal of Materials Science 35(6):1375-1378, Kluwer Academic Publishers, United States (2000).
Xu, S., et al., "Rapid Synthesis of High-Quality InP Nanocrystals," Journal of the American Chemical Society 128(4):1054-1055, American Chemical Society, United States (2006).
Zan, F., et al., "Experimental Studies on Blinking Behavior of Single InP/ZnS Quantum Dots: Effects of Synthetic Conditions and UV Irradiation," Journal of Physical Chemistry 116(6):3944-3950, American Chemical Society, United States (2012).

\* cited by examiner

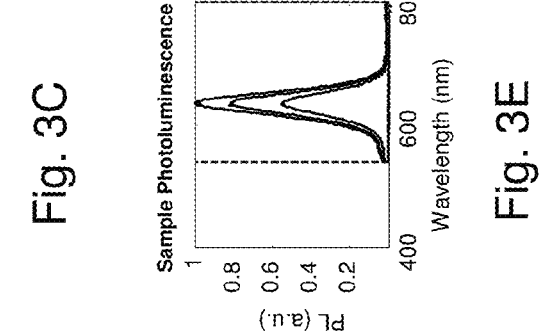
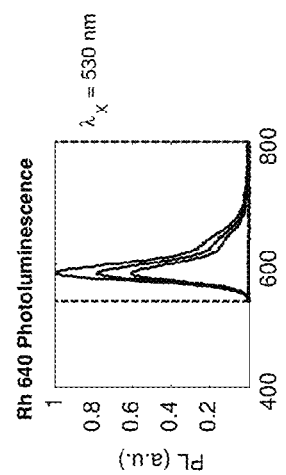
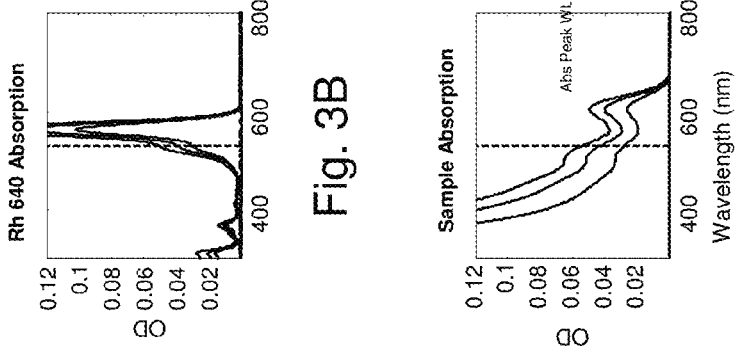
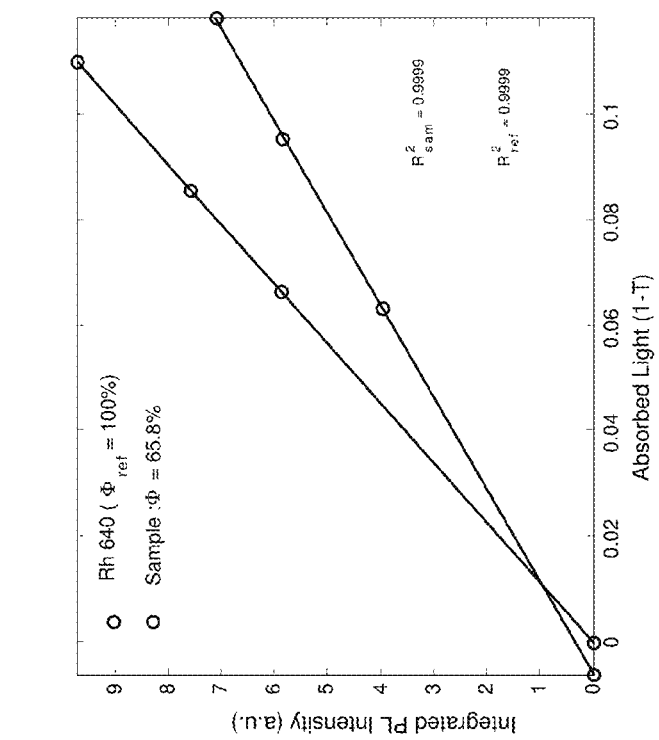
Fig. 3A
Fig. 3B
Fig. 3C
Fig. 3D
Fig. 3E

HIGHLY LUMINESCENT NANOSTRUCTURES AND METHODS OF PRODUCING SAME

CROSS-REFERENCE TO RELATED APPLICATIONS

This application is a non-provisional utility patent application claiming priority to and benefit of the following prior provisional patent application: U.S. Ser. No. 61/667,147, filed Jul. 2, 2012, entitled "HIGHLY LUMINESCENT NANOSTRUCTURES AND METHODS OF PRODUCING SAME" by Wenzhuo Guo et al., which is incorporated herein by reference in its entirety for all purposes.

FIELD OF THE INVENTION

The invention pertains to the field of nanotechnology. More particularly, the invention relates to highly luminescent nanostructures, particularly highly luminescent nanostructures comprising an InP core and one or more shell layers. The invention also relates to methods of producing such nanostructures.

BACKGROUND OF THE INVENTION

Semiconductor nanostructures can be incorporated into a variety of electronic and optical devices. The electrical and optical properties of such nanostructures vary, e.g., depending on their composition, shape, and size. For example, size-tunable properties of semiconductor nanoparticles are of great interest for applications such as light emitting diodes (LEDs), lasers, and biomedical labeling. Highly luminescent nanostructures are particularly desirable for such applications.

Quantum dots with a CdSe core have been produced that exhibit a high quantum yield. However, the intrinsic toxicity of cadmium raises environmental concerns which limit the future application of such cadmium-based nanoparticles. InP-based nanostructures have a similar emission range and are therefore an ideal substitute for CdSe-based materials. High quantum yield InP nanostructures, however, have been difficult to obtain.

Methods for simply and reproducibly producing highly luminescent nanostructures, particularly highly luminescent InP nanostructures, are thus desirable. Among other aspects, the present invention provides such methods. A complete understanding of the invention will be obtained upon review of the following.

SUMMARY OF THE INVENTION

Methods for producing highly luminescent nanostructures are described, including methods of enriching indium nanostructure cores, methods using C5-C8 carboxylic acid ligands during shell synthesis, and methods for two-step growth of a layered $ZnS_xSe_{1-x}/ZnS$ shell. Compositions related to the methods of the invention are also featured, including highly luminescent nanostructures with high quantum yields.

One general class of embodiments provides methods for production of core/shell nanostructures (e.g., quantum dots). In the methods, a nanostructure core is provided, and a shell surrounding the core is produced by providing one or more precursors and reacting the precursors in the presence of a C5-C8 carboxylic acid ligand to produce the shell. The carboxylic acid can be branched or, more preferably, unbranched. Optionally, the carboxylic acid is an unbranched monocarboxylic acid. The carboxylic acid can be saturated or unsaturated.

Thus, in one class of embodiments, the ligand is an alkyl carboxylic acid, preferably an unbranched alkyl carboxylic acid such as pentanoic acid, hexanoic acid, heptanoic acid, or octanoic (caprylic) acid. In other embodiments, the ligand is an alkenyl carboxylic acid or an alkynyl carboxylic acid, for example, 4-pentenoic acid.

The shell can be produced in the presence of a mixture of ligands, e.g., a C5-C8 carboxylic acid ligand and an additional ligand. In one class of embodiments, the additional ligand is a long chain fatty acid ligand, which long chain fatty acid comprises at least 12 carbon atoms.

In one aspect, the nanostructure core is a Group III-V core, e.g., an InP core. The shell typically comprises a material different than the core. In one aspect, the shell comprises a Group II-VI semiconductor, for example, $ZnS_xSe_{1-x}$, where $0 \leq x \leq 1$. The shell optionally comprises more than one layer, which are optionally synthesized in different steps. Accordingly, in one class of embodiments, the shell comprises at least two layers and forming the shell includes providing a first set of one or more precursors and reacting them in the presence of the C5-C8 carboxylic acid ligand to produce a first layer of the shell, and then providing a second set of one or more precursors and reacting them in the presence of the C5-C8 carboxylic acid ligand to produce a second layer of the shell. Different layers typically comprise different materials. For example, the first layer can comprise $ZnS_xSe_{1-x}$, where $0<x<1$ (e.g., where $0.25 \leq x \leq 0.75$ or where x is about 0.5), and the second layer can comprise ZnS. Suitable precursors for shell formation are well known in the art. For example, suitable precursors for $ZnS_xSe_{1-x}$ shell formation, where $0<x<1$, include diethyl zinc, bis(trimethylsilyl)selenide, and hexamethyldisilthiane, and suitable precursors for ZnS shell formation include diethyl zinc and hexamethyldisilthiane.

If desired, the ligand(s) in which the shell was synthesized can be replaced by a different ligand. For example, in one class of embodiments, after shell formation the ligand is exchanged with a dicarboxylic or polycarboxylic acid ligand (e.g., dodecenyl succinic acid), which can further increase quantum yield.

The methods optionally include incorporating the nanostructures into a matrix, a phosphor, and/or a device (e.g., an LED, backlighting unit, downlight, or other display or lighting unit or an optical filter) after their synthesis. Essentially all of the features noted for the other methods and compositions herein apply to these methods as well, as relevant.

Nanostructures and compositions resulting from the methods are also a feature of the invention. Accordingly, one general class of embodiments provides a composition that includes a nanostructure (e.g., a quantum dot) and a C5-C8 carboxylic acid ligand bound to a surface of the nanostructure. The composition optionally includes a population of such nanostructures with bound ligand. The carboxylic acid can be branched or, more preferably, unbranched. Optionally, the carboxylic acid is an unbranched monocarboxylic acid. The carboxylic acid can be saturated or unsaturated.

Thus, in one class of embodiments, the ligand is an alkyl carboxylic acid, preferably an unbranched alkyl carboxylic acid such as pentanoic acid, hexanoic acid, heptanoic acid, or octanoic (caprylic) acid. In other embodiments, the ligand is an alkenyl carboxylic acid or an alkynyl carboxylic acid, for example, 4-pentenoic acid.

The composition optionally includes one or more additional ligands. For example, in one class of embodiments the composition also includes a long chain fatty acid ligand that comprises at least 12 carbon atoms bound to the surface of the nanostructure. In a preferred class of embodiments, the composition includes a dicarboxylic or polycarboxylic acid ligand bound to the surface of the nanostructure, e.g., dodecenyl succinic acid.

The nanostructure can comprise essentially any desired material, for example, a Group II-VI semiconductor, a Group III-V semiconductor, or a combination thereof. Thus, the nanostructure optionally comprises InP and/or $ZnS_xSe_{1-x}$ where $0 \leq x \leq 1$ (e.g., where x=0, x=1, $0 < x < 1$, $0.25 \leq x \leq 0.75$, or x is about 0.5). The nanostructure optionally includes at least one shell.

In one class of embodiments, the nanostructure comprises an InP core and a $ZnS_xSe_{1-x}$ shell, where $0 \leq x \leq 1$, e.g., where $0 \leq x \leq 1$, where $0.25 \leq x \leq 0.75$, or where x is about 0.5. For example, the nanostructure can be an $InP/ZnS_xSe_{1-x}/ZnS$ core/shell quantum dot, where $0 < x < 1$, e.g., where $0.25 \leq x \leq 0.75$ or where x is about 0.5.

The nanostructure or population of nanostructures is optionally embedded in a matrix (e.g., an organic polymer, silicon-containing polymer, inorganic, glassy, and/or other matrix). In one class of embodiments, the nanostructure or population of nanostructures is incorporated into a device, for example, an LED, backlighting unit, downlight, or other display or lighting unit or an optical filter. Essentially all of the features noted for the other compositions and methods herein apply to these compositions as well, as relevant.

As noted, core/shell nanostructures can include more than one layer in their shell. For example, an InP core is advantageously coated with an intermediate layer of ZnSSe followed by an outer layer of ZnS. Accordingly, one general class of embodiments provides a population of $InP/ZnS_xSe_{1-x}/ZnS$ core/shell quantum dots, where $0.25 \leq x \leq 0.75$ (e.g., x is about 0.5) and where the $ZnS_xSe_{1-x}$ shell is between about 0.3 and about 1.0 monolayer thick (e.g., about 0.5 monolayer thick) and the ZnS shell is between about 1.0 and about 3.0 monolayers thick (e.g., about 2 monolayers thick). In one class of embodiments, the $ZnS_xSe_{1-x}$ shell is about 0.5 monolayer thick and the ZnS shell is about 2 monolayers thick.

The InP cores of the quantum dots optionally have an average diameter between about 1 nm and about 5 nm, e.g., between about 15 Å and about 20 Å or between about 25 Å and about 30 Å. The population of nanostructures is optionally embedded in a matrix and/or incorporated into a device, for example, an LED, backlighting unit, downlight, or other display or lighting unit or an optical filter. Essentially all of the features noted for the other compositions and methods herein apply to these compositions as well, as relevant.

Another general class of embodiments provides methods for production of core/shell nanostructures (e.g., quantum dots) where the shell comprises at least two layers. In the methods, an InP nanostructure core and a first set of one or more precursors are provided. The precursors are reacted to produce a first layer of the shell, which first layer comprises $ZnS_xSe_{1-x}$, where $0.25 \leq x \leq 0.75$ (e.g., where x is about 0.5). A second set of one or more precursors is then provided and reacted to produce a second layer of the shell, which second layer comprises ZnS.

Optionally, the core has an average diameter between about 1 nm and about 5 nm. In one exemplary class of embodiments, the core has an average diameter between about 15 Å and about 20 Å. In another exemplary class of embodiments, the core has an average diameter between about 25 Å and about 30 Å.

Suitable precursors for shell formation are well known in the art. For example, suitable precursors for $ZnS_xSe_{1-x}$ shell formation include, but are not limited to, diethyl zinc, bis(trimethylsilyl)selenide, and hexamethyldisilthiane. Suitable precursors for ZnS shell formation include, but are not limited to, diethyl zinc and hexamethyldisilthiane.

Thickness of the shell layers can be conveniently controlled by controlling the amount of precursor provided. Thus, in one class of embodiments, providing a first set of one or more precursors and reacting the precursors to produce a first layer of the shell comprises providing the one or more precursors in an amount whereby, when the reaction is substantially complete, the first layer is between about 0.3 and about 1.0 monolayer of $ZnS_xSe_{1-x}$ thick, e.g., about 0.5 monolayer of $ZnS_xSe_{1-x}$ thick. Similarly, in one class of embodiments providing a second set of one or more precursors and reacting the precursors to produce a second layer of the shell comprises providing the one or more precursors in an amount whereby, when the reaction is substantially complete, the second layer is between about 1.0 and about 3.0 monolayers of ZnS thick, e.g., about 2 monolayers of ZnS thick.

Essentially all of the features noted for the other methods and compositions herein apply to these methods as well, as relevant, for example, with regard to enrichment of the cores, use of ligand, and incorporation of the resulting nanostructures into a matrix, phosphor, and/or device.

Enrichment of InP nanostructures with indium can significantly enhance their quantum yield. Thus, one general class of embodiments provides methods for production of nanostructures. In the methods, InP nanostructures are produced in solution. After the InP nanostructures are removed from the solution in which they were produced, they are suspended in at least one solvent. The suspended nanostructures are contacted with a first precursor, which first precursor comprises In (indium). Suitable first precursors include, e.g., indium carboxylates such as indium laurate.

The nanostructures can be of essentially any desired size. For example, they can have an average diameter between about 1 nm and about 5 nm. In one exemplary class of embodiments, the InP nanostructures have an average diameter between about 15 Å and about 20 Å. In another exemplary class of embodiments, the InP nanostructures have an average diameter between about 25 Å and about 30 Å.

Following enrichment, the In-enriched InP nanostructures are optionally used as cores to which one or more shells are added to produce core/shell nanostructures (e.g., core/shell quantum dots). Thus, in one class of embodiments, after the suspended nanostructures have been contacted with the first precursor, one or more second precursors are added and reacted to form a shell. Typically, the shell comprises a material other than InP, for example, another Group III-V material such as GaP or a Group II-VI material such as ZnS or ZnSe. The shell optionally comprises more than one layer. For example, the resulting nanostructures can be $InP/ZnS_xSe_{1-x}/ZnS$ core/shell quantum dots, where $0 < x < 1$. Accordingly, in one exemplary class of embodiments, forming the shell includes providing a first set of one or more second precursors and reacting them to produce a first layer of the shell, which first layer comprises $ZnS_xSe_{1-x}$, where $0.25 \leq x \leq 0.75$ (e.g., x is about 0.5), and then providing a second set of one or more second precursors and reacting them to produce a second layer of the shell, which second layer comprises ZnS. Suitable precursors for shell formation are well known in the art. For example, suitable precursors for ZnSSe shell formation include diethyl zinc, bis(trimethylsilyl)selenide, and hexamethyldisilthiane, and suitable precursors for ZnS shell formation include diethyl zinc and hexamethyldisilthiane.

Typically, the second precursors are reacted to form the shell in the presence of a ligand. The ligand can be essentially any of those known in the art, or, preferably, can be a C5-C8 carboxylic acid ligand, e.g., any of those C5-C8 carboxylic acid ligands described herein. As an example, the ligand can be an unbranched C5-C8 alkyl carboxylic acid such as hexanoic acid. If desired, the ligand(s) in which the InP nanostructure, InP core, and/or shell was synthesized can be replaced by a different ligand. For example, in one class of embodiments, after shell formation the ligand is exchanged with a dicarboxylic or polycarboxylic acid ligand (e.g., dodecenyl succinic acid).

Essentially all of the features noted for the other methods and compositions herein apply to these methods as well, as relevant, for example, with regard to enrichment of the cores, use of ligand, and incorporation of the resulting nanostructures into a matrix, phosphor, and/or device.

Highly luminescent nanostructures are also a feature of the invention. For example, one general class of embodiments provides a composition comprising a population of nanostructures, which population displays a photoluminescence quantum yield of 70% or greater, wherein a photoluminescence spectrum of the population has a full width at half maximum (FWHM) of 50 nm or less, and wherein the member nanostructures comprise InP. Optionally, the nanostructures are substantially free of Ga. The population can display a photoluminescence quantum yield of 75% or greater, 80% or greater, 85% or greater, or even 90% or greater.

The photoluminescence spectrum of the nanostructures can cover essentially any desired portion of the spectrum. For example, the photoluminescence spectrum of the population can have an emission maximum between 450 nm and 750 nm, e.g., between 500 nm and 650 nm. In one class of embodiments, the photoluminescence spectrum of the population has an emission maximum between 500 nm and 560 nm, e.g., between 500 nm and 540 nm (e.g., in the green portion of the spectrum). In one class of embodiments, the photoluminescence spectrum of the population has an emission maximum between 600 nm and 650 nm (e.g., in the red portion of the spectrum).

As noted, the size distribution of the nanostructures (as indicated, e.g., by the full width at half maximum of the photoluminescence spectrum) is narrow. Optionally, the photoluminescence spectrum of the population has a full width at half maximum of 45 nm or less, or even 40 nm or less or 35 nm or less.

The nanostructures optionally include at least one shell. In one aspect, the nanostructures are quantum dots, e.g., quantum dots with an InP core and one or more shells. In one class of embodiments, the nanostructures are InP/ZnS$_x$Se$_{1-x}$/ZnS core/shell quantum dots, where $0<x<1$, e.g., where $0.25 \leq x \leq 0.75$ or where x is about 0.5. In one class of embodiments, the ZnS$_x$Se$_{1-x}$ layer of the shell is about 0.5 monolayer thick and the ZnS layer of the shell is about 2.0 monolayers thick. Optionally, the InP cores have an average diameter between about 1 nm and about 5 nm, e.g., between about 15 Å and about 20 Å. The average diameter of the quantum dots can be between about 1.8 nm and about 7.5 nm, e.g., between about 30 Å and about 36 Å.

The composition optionally includes one or more nanostructure ligands, e.g., those described herein and/or those known in the art. Thus, in one class of embodiments, the composition includes a C5-C8 carboxylic acid ligand bound to the nanostructures, e.g., an unbranched alkyl carboxylic acid such as pentanoic acid or hexanoic acid. In one class of embodiments, the composition includes a dicarboxylic or polycarboxylic acid ligand bound to the nanostructures, e.g., dodecenyl succinic acid.

The population of nanostructures is optionally embedded in a matrix (e.g., an organic polymer, silicon-containing polymer, inorganic, glassy, and/or other matrix, incorporated into a nanostructure phosphor, and/or incorporated into a device, for example, an LED, backlighting unit, downlight, or other display or lighting unit or an optical filter. Essentially all of the features noted for the other compositions and methods herein apply to these compositions as well, as relevant.

Another general class of embodiments provides a composition comprising a population of nanostructures, which population displays a photoluminescence quantum yield of 75% or greater, wherein the member nanostructures comprise InP and are substantially free of Ga. The population can display a photoluminescence quantum yield of 80% or greater, 85% or greater, or even 90% or greater.

The photoluminescence spectrum of the nanostructures can cover essentially any desired portion of the spectrum. For example, the photoluminescence spectrum of the population can have an emission maximum between 450 nm and 750 nm, e.g., between 500 nm and 650 nm. In one class of embodiments, the photoluminescence spectrum of the population has an emission maximum between 500 nm and 560 nm, e.g., between 500 nm and 540 nm (e.g., in the green portion of the spectrum). In one class of embodiments, the photoluminescence spectrum of the population has an emission maximum between 600 nm and 650 nm (e.g., in the red portion of the spectrum). The size distribution of the nanostructures can be relatively narrow. Thus, the photoluminescence spectrum of the population can have a full width at half maximum of 60 nm or less, e.g., 50 nm or less, 45 nm or less, or even 40 nm or less or 35 nm or less.

The nanostructures optionally include at least one shell. In one aspect, the nanostructures are quantum dots, e.g., quantum dots with an InP core and one or more shells. In one class of embodiments, the nanostructures are InP/ZnS$_x$Se$_{1-x}$/ZnS core/shell quantum dots, where $0<x<1$, e.g., where $0.25 \leq x \leq 0.75$ or where x is about 0.5. In one class of embodiments, the ZnS$_x$Se$_{1-x}$ layer of the shell is about 0.5 monolayer thick and the ZnS layer of the shell is about 2.0 monolayers thick. Optionally, the InP cores have an average diameter between about 1 nm and about 5 nm, e.g., between about 15 Å and about 20 Å. The average diameter of the quantum dots can be between about 1.8 nm and about 7.5 nm, e.g., between about 30 Å and about 36 Å.

The composition optionally includes one or more nanostructure ligands, e.g., those described herein and/or those known in the art. Thus, in one class of embodiments, the composition includes a C5-C8 carboxylic acid ligand bound to the nanostructures, e.g., an unbranched alkyl carboxylic acid such as pentanoic acid or hexanoic acid. In one class of embodiments, the composition includes a dicarboxylic or polycarboxylic acid ligand bound to the nanostructures, e.g., dodecenyl succinic acid.

The population of nanostructures is optionally embedded in a matrix (e.g., an organic polymer, silicon-containing polymer, inorganic, glassy, and/or other matrix, incorporated into a nanostructure phosphor, and/or incorporated into a device, for example, an LED, backlighting unit, downlight, or other display or lighting unit or an optical filter. Essentially all of the features noted for the other compositions and methods herein apply to these compositions as well, as relevant.

Another general class of embodiments provides a composition comprising a population of nanostructures, which population displays a photoluminescence quantum yield of 65% or greater, wherein a photoluminescence spectrum of the population has an emission maximum between 600 nm and 650 nm, and wherein the member nanostructures comprise InP.

The nanostructures optionally include at least one shell. In one aspect, the nanostructures are quantum dots, e.g., quantum dots with an InP core and one or more shells. In one class of embodiments, the nanostructures are $InP/ZnS_xSe_{1-x}/ZnS$ core/shell quantum dots, where $0<x<1$, e.g., where $0.25 \le x \le 0.75$ or where x is about 0.5. In one class of embodiments, the $ZnS_xSe_{1-x}$ layer of the shell is about 0.5 monolayer thick and the ZnS layer of the shell is about 2.0 monolayers thick. Optionally, the InP cores have an average diameter between about 25 Å and about 30 Å. The average diameter of the quantum dots can be between about 40 Å and about 46 Å. The size distribution of the nanostructures can be relatively narrow. For example, the photoluminescence spectrum of the population can have a full width at half maximum of 45 nm or less.

The composition optionally includes one or more nanostructure ligands, e.g., those described herein and/or those known in the art. Thus, in one class of embodiments, the composition includes a C5-C8 carboxylic acid ligand bound to the nanostructures, e.g., an unbranched alkyl carboxylic acid such as pentanoic acid or hexanoic acid. In one class of embodiments, the composition includes a dicarboxylic or polycarboxylic acid ligand bound to the nanostructures, e.g., dodecenyl succinic acid.

The population of nanostructures is optionally embedded in a matrix (e.g., an organic polymer, silicon-containing polymer, inorganic, glassy, and/or other matrix, incorporated into a nanostructure phosphor, and/or incorporated into a device, for example, an LED, backlighting unit, downlight, or other display or lighting unit or an optical filter. Essentially all of the features noted for the other compositions and methods herein apply to these compositions as well, as relevant.

BRIEF DESCRIPTION OF THE DRAWINGS

FIG. 3 illustrates optical characterization of red-emitting InP/ZnSSe/S quantum dots. Panel A presents quantum yield measurement based on rhodamine 640 dye (Rh 640, upper line; dots lower line). Panel B presents absorption spectra of rhodamine 640 dye. Panel C presents photoluminescence spectra of rhodamine 640 dye. Panel D presents absorption spectra of InP/ZnSSe/S dots. Panel E presents photoluminescence spectra of InP/ZnSSe/S dots.

DEFINITIONS

Figure 1A:
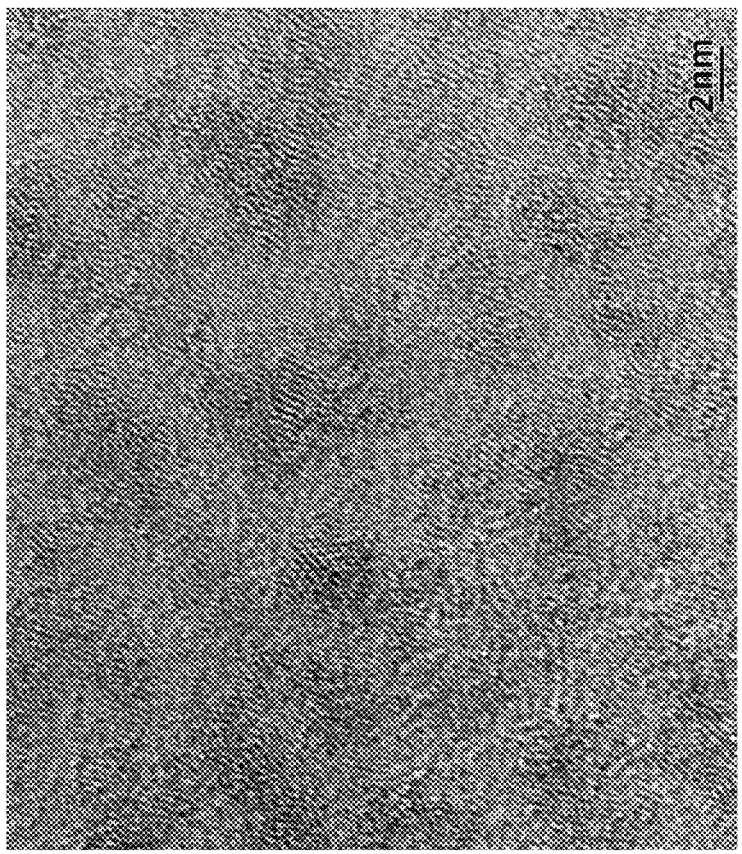
FIG. 1 shows transmission electron micrographs of InP/ZnSSe/ZnS nanostructures at low resolution (Panel A) and high resolution (Panel B).

Unless defined otherwise, all technical and scientific terms used herein have the same meaning as commonly understood by one of ordinary skill in the art to which the invention pertains. The following definitions supplement those in the art and are directed to the current application and are not to be imputed to any related or unrelated case, e.g., to any commonly owned patent or application. Although any methods and materials similar or equivalent to those described herein can be used in the practice for testing of the present invention, the preferred materials and methods are described herein. Accordingly, the terminology used herein is for the purpose of describing particular embodiments only, and is not intended to be limiting.

As used in this specification and the appended claims, the singular forms "a," "an" and "the" include plural referents unless the context clearly dictates otherwise. Thus, for example, reference to "a nanostructure" includes a plurality of such nanostructures, and the like.

The term "about" as used herein indicates the value of a given quantity varies by +/−10% of the value, or optionally +/−5% of the value, or in some embodiments, by +/−1% of the value so described. For example, "about 100 nm" encompasses a range of sizes from 90 nm to 110 nm, inclusive.

A "nanostructure" is a structure having at least one region or characteristic dimension with a dimension of less than about 500 nm, e.g., less than about 200 nm, less than about 100 nm, less than about 50 nm, or even less than about 20 nm or less than about 10 nm. Typically, the region or characteristic dimension will be along the smallest axis of the structure. Examples of such structures include nanowires, nanorods, nanotubes, branched nanostructures, nanotetrapods, tripods, bipods, nanocrystals, nanodots, quantum dots, nanoparticles, and the like. Nanostructures can be, e.g., substantially crystalline, substantially monocrystalline, polycrystalline, amorphous, or a combination thereof. In one aspect, each of the three dimensions of the nanostructure has a dimension of less than about 500 nm, e.g., less than about 200 nm, less than about 100 nm, less than about 50 nm, or even less than about 20 nm or less than about 10 nm.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. (A shell can but need not completely cover the adjacent materials to be considered a shell or for the nanostructure to be considered a heterostructure; for example, a nanocrystal characterized by a core of one material covered with small islands of a second material is a heterostructure.) In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating can but need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell may contain non-crystalline regions and may even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

A "nanocrystal" is a nanostructure that is substantially monocrystalline. A nanocrystal thus has at least one region or characteristic dimension with a dimension of less than about 500 nm, e.g., less than about 200 nm, less than about 100 nm, less than about 50 nm, or even less than about 20 nm or less than about 10 nm. The term "nanocrystal" is intended to encompass substantially monocrystalline nanostructures comprising various defects, stacking faults, atomic substitutions, and the like, as well as substantially monocrystalline nanostructures without such defects, faults, or substitutions. In the case of nanocrystal heterostructures comprising a core and one or more shells, the core of the nanocrystal is typically substantially monocrystalline, but the shell(s) need not be. In one aspect, each of the three dimensions of the nanocrystal has a dimension of less than about 500 nm, e.g., less than about 200 nm, less than about 100 nm, less than about 50 nm, or even less than about 20 nm or less than about 10 nm.

The term "quantum dot" (or "dot") refers to a nanocrystal that exhibits quantum confinement or exciton confinement. Quantum dots can be substantially homogenous in material properties, or in certain embodiments, can be heterogeneous, e.g., including a core and at least one shell. The optical properties of quantum dots can be influenced by their particle size, chemical composition, and/or surface composition, and can be determined by suitable optical testing available in the art. The ability to tailor the nanocrystal size, e.g., in the range between about 1 nm and about 15 nm, enables photoemission coverage in the entire optical spectrum to offer great versatility in color rendering.

A "carboxylic acid" is an organic acid having at least one carboxyl group. A C5 carboxylic acid includes five carbon atoms, a C6 carboxylic acid includes six carbon atoms, a C7 carboxylic acid includes seven carbon atoms, and a C8 carboxylic acid includes eight carbon atoms.

An "alkyl carboxylic acid" has the formula R—COOH, where R is an alkyl group.

An "alkenyl carboxylic acid" has the formula R—COOH, where R is an alkenyl group.

An "alkynyl carboxylic acid" has the formula R—COOH, where R is an alkynyl group.

An "alkyl group" is a functional group that includes only single-bonded carbon and hydrogen atoms. An alkyl group can be unbranched (i.e., linear or straight-chain), branched, or cyclic.

An "alkenyl group" includes only carbon and hydrogen atoms but contains at least one carbon-to-carbon double bond. An alkenyl group can be unbranched (i.e., linear or straight-chain), branched, or cyclic.

An "alkynyl group" contains only carbon and hydrogen atoms and includes at least one triple bond between two carbon atoms. An alkynyl group can be unbranched (i.e., linear or straight-chain), branched, or cyclic.

A "dicarboxylic acid" is a compound having two carboxylic acid moieties (e.g., two monocarboxylic acid moieties or one dicarboxylic acid moiety). A "polycarboxylic acid" is a compound having three or more carboxylic acid moieties.

A "fatty acid" is a monocarboxylic acid with an aliphatic tail (saturated or unsaturated, but including only carbon and hydrogen atoms).

A "precursor" in a nanostructure synthesis reaction is a chemical substance (e.g., a compound or element) that reacts, e.g., with another precursor, and thereby contributes at least one atom to the nanostructure produced by the reaction.

A "ligand" is a molecule capable of interacting (whether weakly or strongly) with one or more faces of a nanostructure, e.g., through covalent, ionic, van der Waals, or other molecular interactions with the surface of the nanostructure.

"Photoluminescence quantum yield" is the ratio of photons emitted to photons absorbed, e.g., by a nanostructure or population of nanostructures. As known in the art, quantum yield is typically determined by a comparative method using well-characterized standard samples with known quantum yield values.

Unless clearly indicated otherwise, ranges listed herein are inclusive.

A variety of additional terms are defined or otherwise characterized herein.

DETAILED DESCRIPTION

Methods for colloidal synthesis of a variety of nanostructures are known in the art. Such methods include techniques for controlling nanostructure growth, e.g., to control the size and/or shape distribution of the resulting nanostructures.

In a typical colloidal synthesis, semiconductor nanostructures are produced by rapidly injecting precursors that undergo pyrolysis into a hot solution (e.g., hot solvent and/or surfactant). The precursors can be injected simultaneously or sequentially. The precursors rapidly react to form nuclei. Nanostructure growth occurs through monomer addition to the nuclei, typically at a growth temperature that is lower than the injection/nucleation temperature.

Surfactant molecules interact with the surface of the nanostructure. At the growth temperature, the surfactant molecules rapidly adsorb and desorb from the nanostructure surface, permitting the addition and/or removal of atoms from the nanostructure while suppressing aggregation of the growing nanostructures. In general, a surfactant that coordinates weakly to the nanostructure surface permits rapid growth of the nanostructure, while a surfactant that binds more strongly to the nanostructure surface results in slower nanostructure growth. The surfactant can also interact with one (or more) of the precursors to slow nanostructure growth.

Nanostructure growth in the presence of a single surfactant typically results in spherical nanostructures. Using a mixture of two or more surfactants, however, permits growth to be controlled such that non-spherical nanostructures can be produced, if, for example, the two (or more) surfactants adsorb differently to different crystallographic faces of the growing nanostructure.

A number of parameters are thus known to affect nanostructure growth and can be manipulated, independently or in combination, to control the size and/or shape distribution of the resulting nanostructures. These include, e.g., temperature (nucleation and/or growth), precursor composition, time-dependent precursor concentration, ratio of the precursors to each other, surfactant composition, number of surfactants, and ratio of surfactant(s) to each other and/or to the precursors.

Synthesis of Group II-VI nanostructures has been described, e.g., in U.S. Pat. Nos. 6,225,198, 6,322,901, 6,207,229, 6,607,829, 7,060,243, 7,374,824, 6,861,155, 7,125,605, 7,566,476, 8,158,193, and 8,101,234 and US patent application publications 2011/0262752 and 2011/0263062.

Although Group II-VI nanostructures such as CdSe/CdS/ZnS core/shell quantum dots can exhibit desirable luminescence behavior, as noted above, issues such as the toxicity of cadmium limit the applications for which such nanostructures can be used. Less toxic alternatives with favorable luminescence properties are thus highly desirable. Group III-V nanostructures in general, and InP-based nanostructures in particular, offer an ideal substitute for cadmium-based materials due to their compatible emission range.

Synthesis of Group III-V nanostructures has been described, e.g., in U.S. Pat. No. 5,505,928 to Alivisatos et al. entitled "Preparation of III-V semiconductor nanocrystals," U.S. Pat. No. 6,306,736 by Alivisatos et al. entitled "Process for forming shaped group III-V semiconductor nanocrystals, and product formed using process," U.S. Pat. No. 6,576,291, U.S. Pat. No. 6,821,337, U.S. Pat. No. 7,138,098, US patent application publication 2003/0214699 by Banin et al. entitled "Method for producing inorganic semiconductor nanocrystalline rods and their use," Wells et al. (1989) "The use of tris(trimethylsilyl)arsine to prepare gallium arsenide and indium arsenide" Chem. Mater. 1:4-6, and Guzelian et al. (1996) "Colloidal chemical synthesis and characterization of InAs nanocrystal quantum dots" 69: 1432-1434.

In particular, synthesis of InP-based nanostructures has been described, e.g., in Xie et al. (2007) "Colloidal InP nanocrystals as efficient emitters covering blue to near-infrared" J. Am. Chem. Soc. 129:15432-15433, Micic et al. (2000) "Core-shell quantum dots of lattice-matched $ZnCdSe_2$ shells on InP cores: Experiment and theory" J. Phys. Chem. B 104:12149-12156, Liu et al. (2008) "Coreduction colloidal synthesis of III-V nanocrystals: The case of InP" Angew. Chem. Int. Ed. 47:3540-3542, Li et al. (2008) "Economic synthesis of high quality InP nanocrystals using calcium phosphide as the phosphorus precursor" Chem. Mater. 20:2621-2623, Battaglia and Peng (2002) "Formation of high quality InP and InAs nanocrystals in a noncoordinating solvent" Nano Lett. 2:1027-1030, Kim et al. (2012) "Highly luminescent InP/GaP/ZnS nanocrystals and their application to white light-emitting diodes" J. Am. Chem. Soc. 134:3804-3809, Nann et al. (2010) "Water splitting by visible light: A nanophotocathode for hydrogen production" Angew. Chem. Int. Ed. 49:1574-1577, Borchert et al. (2002) "Investigation of ZnS passivated InP nanocrystals by XPS" Nano Lett. 2:151-154, Li and Reiss (2008) "One-pot synthesis of highly luminescent InP/ZnS nanocrystals without precursor injection" J. Am. Chem. Soc. 130:11588-11589, Hussain et al. (2009) "One-pot fabrication of high-quality InP/ZnS (core/shell) quantum dots and their application to cellular imaging" Chemphyschem 10:1466-70, Xu et al. (2006) "Rapid synthesis of high-quality InP nanocrystals" J. Am. Chem. Soc. 128: 1054-1055, Micic et al. (1997) "Size-dependent spectroscopy of InP quantum dots" J. Phys. Chem. B 101:4904-4912, Haubold et al. (2001) "Strongly luminescent InP/ZnS core-shell nanoparticles" Chemphyschem 5:331-334, Cros-Gagneux et al. (2010) "Surface chemistry of InP quantum dots: A comprehensive study" J. Am. Chem. Soc. 132:18147-18157, Micic et al. (1995) "Synthesis and characterization of InP, GaP, and $GaInP_2$ quantum dots" J. Phys. Chem. 99:7754-7759, Guzelian et al. (1996) "Synthesis of size-selected, surface-passivated InP nanocrystals" J. Phys. Chem. 100:7212-7219, Lucey et al. (2005) "Monodispersed InP quantum dots prepared by colloidal chemistry in a non-coordinating solvent" Chem. Mater. 17:3754-3762, Lim et al. (2011) "InP@ZnSeS, core@composition gradient shell quantum dots with enhanced stability" Chem. Mater. 23:4459-4463, and Zan et al. (2012) "Experimental Studies on Blinking Behavior of Single InP/ZnS Quantum Dots: Effects of Synthetic Conditions and UV Irradiation" J. Phys. Chem. C 116: 3944-3950. However, such efforts have had only limited success in producing InP nanostructures with high quantum yields.

In one aspect, the present invention overcomes the above noted difficulties (e.g., low quantum yield) by providing techniques for enriching InP nanostructures or nanostructure cores with indium. Ligands whose use in shell growth enhances quantum yield of the resulting core/shell nanostructures are described. Methods for two-step growth of a layered $ZnS_xSe_{1-x}/ZnS$ shell are also described. Compositions related to the methods of the invention are also featured, including highly luminescent nanostructures with high quantum yields and narrow size distributions.

Nanostructure Core Enrichment

Enrichment of InP nanostructures with indium can significantly enhance their quantum yield. Without limitation to any particular mechanism, reactivity of the indium precursor is typically lower than that of the phosphorus precursor, resulting in nanostructures having inherent defects in the crystal structure since the ratio of In:P in the nanostructures is less than 1:1. Again without limitation to any particular mechanism, enrichment of such nanostructures with indium after their initial synthesis can "fill the holes" in the crystal lattice, increasing the In:P ratio (e.g., to 1:1 or essentially 1:1) and improving quality of the crystal structure. Enrichment increases quantum yield and also typically results in a red shift in emission wavelength.

Thus, one general class of embodiments provides methods for production of nanostructures. In the methods, InP nanostructures are produced, typically in solution. After the InP nanostructures are removed from the solution in which they were produced, they are suspended in at least one solvent. The suspended nanostructures are contacted with a first precursor, which first precursor comprises In. The solution in which the suspended nanostructures are contacted with the In-containing precursor is substantially free of any P-containing precursor, since the nanostructures are removed from the solution in which they were synthesized (and optionally washed before resuspension) and since no P-containing precursor is added to the suspended nanostructures. (It will be evident that, although the nanostructures are preferably removed from the solution in which they were produced before enrichment is performed, enrichment can instead be performed with the nanostructures remaining in their growth solution, and such embodiments are also a feature of the invention.)

The InP nanostructures can be produced as described hereinbelow (see, e.g., the sections entitled "Synthesis of InP Core for Green-Emitting Core/Shell Dots" and "Synthesis of InP Core for Red-Emitting Core/Shell Dots" in the Examples) or as known in the art (see, e.g., U.S. Pat. Nos. 7,557,028, 8,062,967, 7,645,397, and US patent application publication 2010/0276638 (e.g., Example 7), as well as the references listed hereinabove). The nanostructures can be of essentially any desired size. For example, the InP nanostructures can have an average diameter between about 1 nm and about 5 nm. In one exemplary class of embodiments, the InP nanostructures have an average diameter between about 15 Å and about 20 Å. In another exemplary class of embodiments, the InP nanostructures have an average diameter between about 25 Å and about 30 Å. Size can be determined as is known in the art, for example, using transmission electron microscopy and/or physical modeling.

The first (In-containing) precursor can be the same as, or different than, the In-containing precursor(s) employed during InP nanostructure synthesis. Suitable first precursors include, but are not limited to, $InCl_3$, chloroindium oxalate, indium oxide, indium phenoxy, and trialkyl, trialkenyl, and trialkynyl indium compounds, among other compounds used in the art as precursors for nanostructure synthesis. In a preferred class of embodiments, the first precursor is an indium carboxylate (i.e., an indium (III) carboxylate), for example, indium acetate, indium stearate, or indium myristate. In a particularly preferred embodiment, the first precursor is indium laurate.

Since a red shift of absorption and photoluminescence wavelength indicative of nanostructure growth is observed upon enrichment with indium, this red shift can be monitored to ensure that an adequate amount of first precursor is provided. For example, a quantity of indium laurate precursor such that the amount of indium in the precursor added to the solution is 7% (mole %) of the amount of indium in the InP nanostructures in the solution has been observed to be the minimum required to produce a red shift; additional precursor does not increase the red shift.

Suitable solvents are known in the art and include those commonly used for nanostructure synthesis, particularly non-coordinating solvents. Exemplary solvents include 1-octadecene, 1-decene, 1-dodecene, and tetradecane.

The temperature at which the nanostructures and first precursor are contacted is typically lower than that at which the nanostructures were grown, for example, 20-80° C. lower (e.g., 200-230° C. compared to a growth temperature of 230-300° C.). The solution containing the nanostructures and precursor is maintained at such temperature until enrichment is complete, e.g., as determined by monitoring absorption and luminescence. Without limitation to any particular mechanism, the red shift in absorption and photoluminescence wavelength initially observed is thought to represent coating of In on the nanostructures, followed by an increase in emission intensity thought to represent diffusion of In into the core without an additional change in the size of the nanostructures. Incubation of the solution containing the nanostructures and precursor can be performed until no further increase in brightness is observed (e.g., for 1-2 hours). The enrichment process can result in a significant increase in quantum yield of the nanostructures, e.g., 10% or more.

Following enrichment, the In-enriched InP nanostructures are optionally used as cores to which one or more shells are added to produce core/shell nanostructures (e.g., core/shell quantum dots). Thus, in one class of embodiments, after the suspended nanostructures have been contacted with the first precursor, one or more second precursors are added and reacted to form a shell. Typically, the shell comprises a material other than InP, for example, another Group III-V material such as GaP or a Group II-VI material such as ZnS or ZnSe.

The shell optionally comprises more than one layer (i.e., the core is surrounded by more than one shell). For example, the resulting nanostructures can be InP/GaP/ZnS, InP/ZnSe/ZnS, InP/ZnSeTe/ZnS, InP/MnSe/ZnS, InP/CdS/ZnS, InP/ZnCdSe/ZnS, InP/ZnCdMgSe/ZnS, or $InP/ZnS_xSe_{1-x}/ZnS$ nanostructures, or, preferably, $InP/ZnS_xSe_{1-x}/ZnS$ core/shell quantum dots, where $0<x<1$. A multilayer shell is optionally synthesized in several discrete steps, as described in greater detail hereinbelow; see, e.g., the sections entitled "Multilayered Shells," "Indium Enrichment and Shelling Process for Green-Emitting Dots," and "Indium Enrichment and Shelling Process for Red-Emitting Dots." Accordingly, in one exemplary class of embodiments, forming the shell includes providing a first set of one or more second precursors and reacting them to produce a first layer of the shell, which first layer comprises $ZnS_xSe_{1-x}$, where $0<x<1$, and then providing a second set of one or more second precursors and reacting them to produce a second layer of the shell, which second layer comprises ZnS. Preferably, $0.25 \le x \le 0.75$, e.g., x is about 0.5.

Suitable precursors for shell formation are well known in the art. For example, suitable precursors for $ZnS_xSe_{1-x}$ shell formation, where $0<x<1$, include diethyl zinc, zinc carboxylates (e.g., zinc stearate or zinc hexanoate), bis(trimethylsilyl) selenide, elemental selenium (e.g., dissolved in tributylphosphine), hexamethyldisilthiane, and organic thiols (e.g., 1-dodecanethiol, tert-dodecylmercaptan, or 1-octanethiol), and suitable precursors for ZnS shell formation include diethyl zinc, zinc carboxylates (e.g., zinc stearate or zinc hexanoate), hexamethyldisilthiane, and organic thiols (e.g., 1-dodecanethiol, tert-dodecylmercaptan, or 1-octanethiol). Shell layer thickness is optionally controlled by controlling the amount of precursor(s) provided, as described hereinbelow.

Typically, the second precursors are reacted to form the shell in the presence of a ligand. The ligand can be essentially any of those known in the art, or, preferably, can be a C5-C8 carboxylic acid ligand, e.g., any of those C5-C8 carboxylic acid ligands described hereinbelow; see the section entitled "C5-C8 Carboxylic Acid Ligands." As an example, the ligand can be an unbranched C5-C8 alkyl carboxylic acid such as hexanoic acid.

If desired, the ligand(s) in which the InP nanostructure, InP core, and/or shell was synthesized can be replaced by a different ligand. For example, in one class of embodiments, after shell formation the ligand is exchanged with a dicarboxylic or polycarboxylic acid ligand (e.g., dodecenyl succinic acid).

A variety of suitable ligands (e.g., for core synthesis, shell synthesis, and/or post-synthesis exchange) are known in the art. As a few examples, in addition to those described herein, such ligands include (but are not limited to) dicarboxylic acid, polycarboxylic acid, dicarbinol, alcohol, amine, polymeric silicone, and/or organic polymeric ligands as described in US patent application publications 2010/0276638 and 2007/0034833, amine functional polystyrene ligands and polyethyleneimine or modified polyethyleneimine ligands as described in US patent application publication 2012/0113672, silsesquioxane ligands (including polyhedral oligomeric silsesquioxane and/or carboxylic acid ligands) as described in U.S. Pat. Nos. 7,267,875 and 7,585,564 and US patent application publication 2008/0118755, carboxylic acid siloxane polymer ligands as described in U.S. patent application Ser. No. 13/803,596, and alkylamine siloxane polymer ligands as described in U.S. provisional patent application 61/663,234 and U.S. patent application Ser. No. 13/803,596.

The resulting nanostructures (e.g., quantum dots, e.g., InP/ZnS$_x$Se$_{1-x}$/ZnS quantum dots) optionally display a high photoluminescence quantum yield, e.g., 65% or greater, 70% or greater, 75% or greater, 80% or greater, 85% or greater, or even 90% or greater. The photoluminescence spectrum of the nano structures can cover essentially any desired portion of the spectrum. For example, the photoluminescence spectrum can have an emission maximum between 450 nm and 750 nm, e.g., between 500 nm and 650 nm, between 500 nm and 560 nm, or between 600 nm and 650 nm. The photoluminescence spectrum can have a full width at half maximum of 60 nm or less, e.g., 50 nm or less, 45 nm or less, or even 40 nm or less or 35 nm or less, reflecting the narrow size distribution of the nanostructures.

The resulting nanostructures are optionally embedded in a matrix (e.g., an organic polymer, silicon-containing polymer, inorganic, glassy, and/or other matrix), used in production of a nanostructure phosphor, and/or incorporated into a device, e.g., an LED, backlight, downlight, or other display or lighting unit or an optical filter. Exemplary phosphors and lighting units can, e.g., generate a specific color light by incorporating a population of nanostructures with an emission maximum at or near the desired wavelength or a wide color gamut by incorporating two or more different populations of nanostructures having different emission maxima. A variety of suitable matrices are known in the art. See, e.g., U.S. Pat. No. 7,068,898 and US patent application publications 2010/0276638, 2007/0034833, and 2012/0113672. Exemplary nanostructure phosphor films, LEDs, backlighting units, etc. are described, e.g., in US patent application publications 2010/0276638, 2012/0113672, 2008/0237540, 2010/0110728, and 2010/0155749 and U.S. Pat. Nos. 7374807, 7645397, 6501091, and 6803719.

As another example, the resulting nanostructures can be used for imaging or labeling, e.g., biological imaging or labeling. Thus, the resulting nanostructures are optionally covalently or noncovalently bound to biomolecule(s), including, but not limited to, a peptide or protein (e.g., an antibody or antibody domain, avidin, streptavidin, neutravidin, or other binding or recognition molecule), a ligand (e.g., biotin), a polynucleotide (e.g., a short oligonucleotide or longer nucleic acid), a carbohydrate, or a lipid (e.g., a phospholipid or other micelle). One or more nanostructures can be bound to each biomolecule, as desired for a given application. Such nanostructure-labeled biomolecules find use, for example, in vitro, in vivo, and in cellulo, e.g., in exploration of binding or chemical reactions as well as in subcellular, cellular, and organismal labeling.

Nanostructures resulting from the methods are also a feature of the invention. Thus, one class of embodiments provides a population of InP nanostructures or nanostructures comprising InP cores in which the nanostructures or cores have an In:P ratio of essentially 1:1 (e.g., greater than 0.99:1). The nanostructures are optionally quantum dots.

It will be evident that the methods can be applied to synthesis of nanostructures other than InP nanostructures where the ratio of the two or more elements constituting the nanostructures does not reach its ideal during synthesis of the nanostructures. Accordingly, one general class of embodiments provides methods for production of nanostructures in which nanostructures comprising a first element and a second element are produced in solution. The nanostructures are removed from the solution in which they were produced and then suspended in at least one solvent. The suspended nanostructures are contacted with a precursor comprising the first element (but typically not with a precursor comprising the second element), at a temperature and for a time sufficient for enrichment of the nanostructures with the first element to occur as described above for indium.

Shell Formation

In one aspect, the highly luminescent nanostructures of the present invention include a core and at least one shell. The shell can, e.g., increase the quantum yield and/or stability of the nanostructures. Typically, the core and the one or more shells comprise different materials. The core is generally synthesized first, optionally enriched as described above, and then additional precursors from which the shell (or a layer thereof) is produced are provided.

Typically, the core and shell(s) are synthesized in the presence of at least one nanostructure ligand. Ligands can, e.g., enhance the miscibility of nanostructures in solvents or polymers (allowing the nanostructures to be distributed throughout a composition such that the nanostructures do not aggregate together), increase quantum yield of nanostructures, and/or preserve nanostructure luminescence (e.g., when the nanostructures are incorporated into a matrix). The ligand(s) for core synthesis and for shell synthesis can but need not be the same. Similarly, following synthesis, any ligand on the surface of the nanostructures can be exchanged for a different ligand with other desirable properties.

Suitable ligands for synthesis of nanostructure cores, including InP cores, are known in the art. Exemplary ligands include fatty acids (e.g., lauric, caproic, myristic, palmitic, stearic, and oleic acid), organic phosphine oxides (e.g., trioctylphosphine oxide (TOPO), triphenylphosphine oxide, and tributylphosphine oxide), and organic amines (e.g., dodecylamine and oleylamine).

Although ligands for synthesis of nanostructure shells are also known in the art, recent work at Nanosys has demonstrated that carboxylic acid ligands shorter than the fatty acids typically used for core synthesis result in core/shell nanostructures exhibiting higher quantum yields.

C5-C8 Carboxylic Acid Ligands

Accordingly, one general class of embodiments provides methods for production of core/shell nanostructures. In the methods, a nanostructure core is provided, and a shell surrounding the core is produced by providing one or more precursors and reacting the precursors in the presence of a C5-C8 carboxylic acid ligand to produce the shell. The carboxylic acid can be branched (e.g., having a one carbon branch) or, more preferably, unbranched. Without limitation to any particular mechanism, ligands with little steric hindrance (such as, e.g., unbranched carboxylic acid ligands) offer maximum nanostructure surface coverage, resulting in higher quantum yields. Optionally, the carboxylic acid is an unbranched monocarboxylic acid. The carboxylic acid can be saturated or unsaturated.

Thus, in one class of embodiments, the ligand is an alkyl carboxylic acid, preferably an unbranched alkyl carboxylic acid such as pentanoic acid, hexanoic acid, heptanoic acid, or octanoic (caprylic) acid. In other embodiments, the ligand is an alkenyl carboxylic acid or an alkynyl carboxylic acid, for example, 4-pentenoic acid.

The shell can be produced in the presence of a mixture of ligands, e.g., a C5-C8 carboxylic acid ligand and an additional ligand (whether added during shell synthesis or remaining in the reaction mixture from core synthesis). For example, shell synthesis can be performed with a C5-C8 carboxylic acid ligand and an additional carboxylic acid ligand, e.g., a fatty acid ligand. In one class of embodiments, the additional ligand is a long chain fatty acid ligand, which long chain fatty acid comprises at least 12 carbon atoms. The fatty acid can be saturated or unsaturated, and can comprise less than 30 or less than 20 carbon atoms. Suitable fatty acids include, e.g., oleic acid, lauric acid, myristic acid, palmitic acid, or stearic acid. To maximize quantum yield of the resulting nanostructures, the long chain fatty acid preferably constitutes less than 50 molar percent of the total ligand in the mixture, more preferably, less than 25 molar %, less than 10 molar %, or less than 5 molar %.

In one aspect, the nanostructure core is a Group III-V core, e.g., an InAs, GaP, GaN, InN, or GaAs core. In one class of embodiments, the nanostructure core is an InP core. The core can be produced as described hereinbelow (see, e.g., the sections entitled "Synthesis of InP Core for Green-Emitting Core/Shell Dots" and "Synthesis of InP Core for Red-Emitting Core/Shell Dots" in the Examples) or as known in the art (see, e.g., U.S. Pat. No. 7,557,028, U.S. Pat. No. 8,062,967, U.S. Pat. No. 7,645,397, and US patent application publication 2010/0276638 (e.g., Example 7), as well as the references listed hereinabove). The core can be of essentially any desired size. For example, the core optionally has an average diameter between about 1 nm and about 5 nm. In one exemplary class of embodiments, the core has an average diameter between about 15 Å and about 20 Å. In another exemplary class of embodiments, the core has an average diameter between about 25 Å and about 30 Å. Optionally, the resulting nanostructures are quantum dots.

The shell typically comprises a material different than the core. In one aspect, the shell comprises a Group II-VI semiconductor, for example, $ZnS_xSe_{1-x}$, where $0 \leq x \leq 1$ (e.g., where x=0, x=1, 0<x<1, 0.25≤x≤0.75, or x is about 0.5), ZnS, ZnSe, ZnSeTe, MnSe, MgSe, CdS, CdSe, ZnCdSe, or ZnCdMgSe.

The shell optionally comprises more than one layer. A multilayer shell is optionally synthesized in several discrete steps, as described in greater detail hereinbelow; see, e.g., the sections entitled "Multilayered Shells," "Indium Enrichment and Shelling Process for Green-Emitting Dots," and "Indium Enrichment and Shelling Process for Red-Emitting Dots." Accordingly, in one class of embodiments, the shell comprises at least two layers and forming the shell includes providing a first set of one or more precursors and reacting them in the presence of the C5-C8 carboxylic acid ligand to produce a first layer of the shell, and then providing a second set of one or more precursors and reacting them in the presence of the C5-C8 carboxylic acid ligand to produce a second layer of the shell. Different layers typically comprise different materials. For example, the first layer can comprise $ZnS_xSe_{1-x}$, where 0<x<1 (e.g., where 0.25≤x≤0.75 or where x is about 0.5), and the second layer can comprise ZnS.

Suitable precursors for shell formation are well known in the art. For example, suitable precursors for $ZnS_xSe_{1-x}$ shell formation, where 0<x<1, include diethyl zinc, zinc carboxylates (e.g., zinc stearate or zinc hexanoate), bis(trimethylsilyl) selenide, elemental selenium (e.g., dissolved in tributylphosphine), hexamethyldisilthiane, and organic thiols (e.g., 1-dodecanethiol, tert-dodecylmercaptan, or 1-octanethiol), and suitable precursors for ZnS shell formation include diethyl zinc, zinc carboxylates (e.g., zinc stearate or zinc hexanoate), hexamethyldisilthiane, and organic thiols (e.g., 1-dodecanethiol, tert-dodecylmercaptan, or 1-octanethiol). Shell layer thickness is optionally controlled by controlling the amount of precursor(s) provided, as described hereinbelow.

If desired, the ligand(s) in which the shell was synthesized can be replaced by a different ligand. A variety of suitable ligands are known in the art, for example, the dicarboxylic acid, polycarboxylic acid, dicarbinol, alcohol, amine, polymeric silicone, and/or organic polymeric ligands described in US patent application publications 2010/0276638 and 2007/0034833, the amine functional polystyrene ligands and polyethyleneimine or modified polyethyleneimine ligands described in US patent application publication 2012/0113672, the silsesquioxane ligands (including polyhedral oligomeric silsesquioxane and/or carboxylic acid ligands) described in U.S. Pat. Nos. 7,267,875 and 7,585,564 and US patent application publication 2008/0118755, the carboxylic acid siloxane polymer ligands as described in U.S. patent application Ser. No. 13/803,596, and the alkylamine siloxane polymer ligands described in US provisional patent application 61/663,234 and U.S. patent application Ser. No. 13/803,596. For example, in one class of embodiments, after shell formation the ligand is exchanged with a dicarboxylic or polycarboxylic acid ligand (e.g., dodecenyl succinic acid), which can further increase quantum yield.

The resulting nanostructures (e.g., quantum dots, e.g., InP/$ZnS_xSe_{1-x}$/ZnS quantum dots) optionally display a high photoluminescence quantum yield, e.g., 65% or greater, 70% or greater, 75% or greater, 80% or greater, 85% or greater, or even 90% or greater. The photoluminescence spectrum of the nano structures can cover essentially any desired portion of the spectrum. For example, the photoluminescence spectrum can have an emission maximum between 450 nm and 750 nm, e.g., between 500 nm and 650 nm, between 500 nm and 560 nm, or between 600 nm and 650 nm. The photoluminescence spectrum can have a full width at half maximum of 60 nm or less, e.g., 50 nm or less, 45 nm or less, or even 40 nm or less or 35 nm or less.

The resulting nanostructures are optionally embedded in a matrix (e.g., an organic polymer, silicon-containing polymer, inorganic, glassy, and/or other matrix), used in production of a nanostructure phosphor, and/or incorporated into a device, e.g., an LED, backlighting unit, downlight, or other display or lighting unit or an optical filter, or bound to a biomolecule, as for the embodiments described above.

Nanostructures and compositions resulting from the methods are also a feature of the invention. Accordingly, one general class of embodiments provides a composition that includes a nanostructure (e.g., a quantum dot) and a C5-C8 carboxylic acid ligand bound to a surface of the nanostructure. The composition optionally includes a population of such nanostructures with bound ligand. As will be appreciated, "bound" ligand is ligand that interacts (whether weakly or strongly) with one or more faces of a nanostructure, e.g., through covalent, ionic, van der Waals, or other molecular interactions with the surface of the nanostructure. Bound ligand typically remains associated with the nanostructures when they are pelleted by centrifugation, precipitated, or otherwise fractionated. The carboxylic acid can be branched (e.g., having a one carbon branch) or, more preferably, unbranched. Optionally, the carboxylic acid is an unbranched monocarboxylic acid. The carboxylic acid can be saturated or unsaturated.

Thus, in one class of embodiments, the ligand is an alkyl carboxylic acid, preferably an unbranched alkyl carboxylic acid such as pentanoic acid, hexanoic acid, heptanoic acid, or octanoic (caprylic) acid. In other embodiments, the ligand is an alkenyl carboxylic acid or an alkynyl carboxylic acid, for example, 4-pentenoic acid.

The composition optionally includes one or more additional ligands. For example, in one class of embodiments the composition also includes a fatty acid ligand (saturated or unsaturated) bound to the surface of the nanostructure. Optionally, the fatty acid is long chain fatty acid that comprises at least 12 carbon atoms, and can comprise less than 30 or less than 20 carbon atoms. Suitable fatty acids include, e.g., oleic acid, lauric acid, myristic acid, palmitic acid, and stearic acid. To maximize quantum yield of the nanostructure, the long chain fatty acid preferably constitutes less than 50 molar % of the total ligand in the composition, more preferably, less than 25 molar %, less than 10 molar %, or less than 5 molar %. In a preferred class of embodiments, the composition includes a dicarboxylic or polycarboxylic acid ligand bound to the surface of the nanostructure, e.g., dodecenyl succinic acid. A large number of other suitable ligands are known in the art; see, e.g., the dicarboxylic acid, polycarboxylic acid, dicarbinol, alcohol, amine, polymeric silicone, and/or organic polymeric ligands described in US patent application publications 2010/0276638 and 2007/0034833, the amine functional polystyrene ligands and polyethyleneimine or modified polyethyleneimine ligands described in US patent application publication 2012/0113672, the silsesquioxane ligands (including polyhedral oligomeric silsesquioxane and/or carboxylic acid ligands) described in U.S. Pat. Nos. 7,267,875 and 7,585,564 and US patent application publication 2008/0118755, the carboxylic acid siloxane polymer ligands as described in U.S. patent application Ser. No. 13/803,596, and the alkylamine siloxane polymer ligands described in U.S. provisional patent application 61/663,234 and U.S. patent application Ser. No. 13/803,596.

The nanostructure can comprise essentially any desired material, for example, a Group II-VI semiconductor, a Group III-V semiconductor, or a combination thereof. Thus, the nanostructure optionally comprises InP, $ZnS_xSe_{1-x}$ where $0 \leq x \leq 1$ (e.g., where x=0, x=1, 0<x<1, $0.25 \leq x \leq 0.75$, or x is about 0.5), ZnS, ZnSe, ZnSeTe, MnSe, MgSe, CdS, CdSe, ZnCdSe, ZnCdMgSe, InAs, GaP, GaN, InN, and/or GaAs. The nanostructure optionally includes at least one shell.

In one class of embodiments, the nanostructure comprises an InP core and a $ZnS_xSe_{1-x}$ shell, where $0 \leq x \leq 1$, e.g., where 0<x<1, where $0.25 \leq x \leq 0.75$, or where x is about 0.5. For example, the nanostructure can be an $InP/ZnS_xSe_{1-x}/ZnS$ core/shell quantum dot, where 0<x<1, e.g., where $0.25 \leq x \leq 0.75$ or where x is about 0.5. The nanostructure (e.g., quantum dot, e.g., $InP/ZnS_xSe_{1-x}/ZnS$ quantum dot) optionally has a photoluminescence quantum yield of 65% or greater, e.g., 70% or greater, 75% or greater, 80% or greater, 85% or greater, or even 90% or greater. The photoluminescence spectrum of the nanostructure can cover essentially any desired portion of the spectrum. For example, the photoluminescence spectrum can have an emission maximum between 450 nm and 750 nm, e.g., between 500 nm and 650 nm, between 500 nm and 560 nm, or between 600 nm and 650 nm. The photoluminescence spectrum for a population of the nanostructures can have a full width at half maximum of 60 nm or less, e.g., 50 nm or less, 45 nm or less, or even 40 nm or less or 35 nm or less.

The nanostructure or population of nanostructures is optionally embedded in a matrix (e.g., an organic polymer, silicon-containing polymer, inorganic, glassy, and/or other matrix). In one class of embodiments, the nanostructure or population of nanostructures is incorporated into a device, for example, an LED, backlighting unit, downlight, or other display or lighting unit or an optical filter. As noted above, exemplary matrices and devices are known in the art. Also as noted above, the nanostructure can be covalently or noncovalently bound to a biomolecule.

Multilayered Shells

As noted, core/shell nanostructures can include more than one layer in their shell. For example, an InP core is advantageously coated with an intermediate layer of ZnSSe followed by an outer layer of ZnS. ZnSSe has a smaller lattice mismatch with InP than does ZnS. Providing a thin intermediate layer of ZnSSe over the InP core thus increases quantum yield. Application of a ZnS outer layer further increases quantum yield and also enhances stability of the nanostructures.

Although graded ZnSSe shells have been described (Lim et al. (2011) "InP@ZnSeS, core@composition gradient shell quantum dots with enhanced stability" Chem. Mater. 23:4459-4463), synthesis of a layered ZnSSe/ZnS shell in at least two discrete steps provides greater control over thickness of the resulting layers. Similarly, synthesis of the core and the shell in different steps also provides greater flexibility, for example, the ability to employ different solvent and ligand systems in the core and shell synthesis. Multi-step synthesis techniques can thus facilitate production of nanostructures with a narrow size distribution (i.e., a small FWHM) and high quantum yield. Accordingly, one aspect of the invention provides methods for forming a shell comprising at least two layers, in which one or more precursors are provided and reacted to form a first layer, and then (typically when formation of the first layer is substantially complete) one or more precursors for formation of a second layer are provided and reacted.

One general class of embodiments provides methods for production of core/shell nanostructures (e.g., quantum dots) where the shell comprises at least two layers. In the methods, an InP nanostructure core and a first set of one or more precursors are provided. The precursors are reacted to produce a first layer of the shell, which first layer comprises $ZnS_xSe_{1-x}$, where 0<x<1 (preferably where $0.25 \leq x \leq 0.75$, or where x is about 0.5). A second set of one or more precursors is provided and reacted to produce a second layer of the shell, which second layer comprises ZnS. Typically, the second set of precursors is provided after reaction of the first set to form a first layer is substantially complete (e.g., when at least one of the first precursors is depleted or removed from the reaction or when no additional growth is detectable).

The InP core can be produced as described hereinbelow (see, e.g., the sections entitled "Synthesis of InP Core for Green-Emitting Core/Shell Dots" and "Synthesis of InP Core for Red-Emitting Core/Shell Dots" in the Examples) or as known in the art (see, e.g., U.S. Pat. Nos. 7,557,028, 8,062, 967, 7,645,397, and US patent application publication 2010/0276638 (e.g., Example 7), as well as the references listed hereinabove). The core can be of essentially any desired size. Optionally, the core has an average diameter between about 1 nm and about 5 nm. In one exemplary class of embodiments, the core has an average diameter between about 15 Å and about 20 Å. In another exemplary class of embodiments, the core has an average diameter between about 25 Å and about 30 Å.

Suitable precursors for shell formation are well known in the art. For example, suitable precursors for $ZnS_xSe_{1-x}$ shell formation, where 0<x<1, include, but are not limited to, diethyl zinc, zinc carboxylates (e.g., zinc stearate or zinc hexanoate), bis(trimethylsilyl)selenide, elemental selenium (e.g., dissolved in tributylphosphine), hexamethyldisilthiane, and organic thiols (e.g., 1-dodecanethiol, tert-dodecylmercaptan, or 1-octanethiol). Suitable precursors for ZnS shell formation include, but are not limited to, diethyl zinc, zinc carboxylates (e.g., zinc stearate or zinc hexanoate), hexamethyldisilthiane, and organic thiols (e.g., 1-dodecanethiol, tert-dodecylmercaptan, or 1-octanethiol).

Thickness of the shell layers can be conveniently controlled by controlling the amount of precursor provided. For a given layer, at least one of the precursors is optionally provided in an amount whereby, when the growth reaction is substantially complete, the layer is of predetermined thickness. If more than one different precursor is provided, either the amount of each precursor can be so limited or one of the precursors can be provided in limiting amount while the others are provided in excess. Suitable precursor amounts for various resulting desired shell thicknesses can be readily calculated. For example, the InP core can be dispersed in solution after its synthesis and purification, and its concentration can be calculated, e.g., by UV/Vis spectroscopy using the Beer-Lambert law. The extinction coefficient can be obtained from bulk InP. The size of the InP core can be determined, e.g., by excitonic peak of UV/Vis absorption spectrum and physical modeling based on quantum confinement. With the knowledge of particle size, molar quantity, and the desired resulting thickness of shelling material, the amount of precursor can be calculated using the bulk crystal parameters (i.e., the thickness of one monolayer of shelling material).

In one class of embodiments, providing a first set of one or more precursors and reacting the precursors to produce a first layer of the shell comprises providing the one or more precursors in an amount whereby, when the reaction is substantially complete, the first layer is between about 0.3 and about 1.0 monolayer of $ZnS_xSe_{1-x}$ thick, e.g., about 0.5 monolayer of $ZnS_xSe_{1-x}$ thick. Typically, this thickness is calculated assuming that precursor conversion is 100% efficient. (As noted above, a shell can but need not completely cover the underlying material. Without limitation to any particular mechanism and purely for the sake of example, where the first layer of the shell is about 0.5 monolayer of $ZnS_xSe_{1-x}$ thick, the core can be covered with small islands of $ZnS_xSe_{1-x}$ or about 50% of the cationic sites and 50% of the anionic sites can be occupied by the shell material.) Similarly, in one class of embodiments providing a second set of one or more precursors and reacting the precursors to produce a second layer of the shell comprises providing the one or more precursors in an amount whereby, when the reaction is substantially complete, the second layer is between about 1.0 and about 3.0 monolayers of ZnS thick, e.g., about 2 monolayers of ZnS thick or about 2.8-3 monolayers thick. Given, e.g., that one monolayer of $ZnS_{0.5}Se_{0.5}$ is 3.19 Å thick and one monolayer of ZnS is 3.12 Å thick, thickness of the resulting layers in Å can be calculated if desired.

Typically, the precursors are reacted to form the shell layers in the presence of a ligand. The ligand can be essentially any of those known in the art, or, preferably, can be a C5-C8 carboxylic acid ligand, e.g., any of those C5-C8 carboxylic acid ligands described above; see the section entitled "C5-C8 Carboxylic Acid Ligands." As an example, the ligand can be an unbranched C5-C8 alkyl carboxylic acid such as hexanoic acid. If desired, the ligand(s) in which the shells were synthesized can be replaced by a different ligand. A variety of suitable ligands (e.g., for core synthesis, shell synthesis, and/or subsequent exchange) are known in the art. As a few examples, in addition to those described herein, such ligands include (but are not limited to) dicarboxylic acid, polycarboxylic acid, dicarbinol, alcohol, amine, polymeric silicone, and/or organic polymeric ligands as described in US patent application publications 2010/0276638 and 2007/0034833, amine functional polystyrene ligands and polyethyleneimine or modified polyethyleneimine ligands as described in US patent application publication 2012/0113672, silsesquioxane ligands (including polyhedral oligomeric silsesquioxane and/or carboxylic acid ligands) as described in U.S. Pat. Nos. 7,267,875 and 7,585,564 and US patent application publication 2008/0118755, carboxylic acid siloxane polymer ligands as described in U.S. patent application Ser. No. 13/803,596, and alkylamine siloxane polymer ligands as described in U.S. provisional patent application 61/663,234 and U.S. patent application Ser. No. 13/803,596. For example, in one class of embodiments, after shell formation the ligand is exchanged with a dicarboxylic or polycarboxylic acid ligand (e.g., dodecenyl succinic acid).

The resulting nanostructures (e.g., quantum dots, e.g., InP/$ZnS_xSe_{1-x}$/ZnS quantum dots) optionally display a high photoluminescence quantum yield, e.g., 65% or greater, 70% or greater, 75% or greater, 80% or greater, 85% or greater, or even 90% or greater. The photoluminescence spectrum of the nanostructures can cover essentially any desired portion of the spectrum. For example, the photoluminescence spectrum can have an emission maximum between 450 nm and 750 nm, e.g., between 500 nm and 650 nm, between 500 nm and 560 nm, or between 600 nm and 650 nm. The photoluminescence spectrum can have a full width at half maximum of 60 nm or less, e.g., 50 nm or less, 45 nm or less, or even 40 nm or less or 35 nm or less.

The resulting nanostructures are optionally embedded in a matrix (e.g., an organic polymer, silicon-containing polymer, inorganic, glassy, and/or other matrix), used in production of a nanostructure phosphor, and/or incorporated into a device, e.g., an LED, backlighting unit, downlight, or other display or lighting unit or an optical filter, or bound to a biomolecule, as described above.

Nanostructures resulting from the methods are also a feature of the invention. Thus, one class of embodiments provides a population of InP/$ZnS_xSe_{1-x}$/ZnS core/shell nanostructures, where 0<x<1, wherein the $ZnS_xSe_{1-x}$ shell is between about 0.3 and about 1.0 monolayer thick (e.g., about 0.5 monolayer thick) and the ZnS shell is between about 1.0 and about 3.0 monolayers thick (e.g., about 2 monolayers thick or about 2.8-3 monolayers thick). In a preferred class of embodiments, 0.25≤x≤0.75, e.g., x is about 0.5. In one class of embodiments, the $ZnS_xSe_{1-x}$ shell is about 0.5 monolayer thick and the ZnS shell is about 2 monolayers thick. In one class of embodiments, the $ZnS_xSe_{1-x}$ shell is about 0.5 monolayer thick and the ZnS shell is about 2.8-3.0 monolayers thick.

In one class of embodiments, the nanostructures are quantum dots. The InP cores of the quantum dots optionally have an average diameter between about 1 nm and about 5 nm, e.g., between about 15 Å and about 20 Å or between about 25 Å and about 30 Å. The nanostructures (e.g., quantum dots) optionally display a high photoluminescence quantum yield, e.g., 65% or greater, 70% or greater, 75% or greater, 80% or greater, 85% or greater, or even 90% or greater. The photoluminescence spectrum of the nanostructures can cover essentially any desired portion of the spectrum. For example, the photoluminescence spectrum can have an emission maximum between 450 nm and 750 nm, e.g., between 500 nm and 650 nm, between 500 nm and 560 nm, or between 600 nm and 650 nm. The photoluminescence spectrum can have a full width at half maximum of 60 nm or less, e.g., 50 nm or less, 45 nm or less, or even 40 nm or less or 35 nm or less.

The nanostructures optionally have a ligand bound to their surface, for example, any of those ligands described hereinabove (e.g., a C5-C8 carboxylic acid ligand, a fatty acid ligand, a dicarboxylic acid ligand, and/or a polycarboxylic acid ligand). The population of nanostructures is optionally embedded in a matrix (e.g., an organic polymer, silicon-containing polymer, inorganic, glassy, and/or other matrix) and/or incorporated into a device, for example, an LED, backlighting unit, downlight, or other display or lighting unit, as described above. Also as noted above, the nanostructures can be covalently or noncovalently bound to a biomolecule.

Highly Luminescent Nanostructures

Employing the various techniques detailed herein (e.g., indium core enrichment, synthesis of ZnSSe/ZnS shells, and/or use of C5-C8 carboxylic acid ligands during shell synthesis followed by ligand replacement with dicarboxylic acid or polycarboxylic acid ligands) permits synthesis of nanostructures exhibiting quantum yields higher than those previously achieved in the art. Highly luminescent nanostructures are thus a feature of the invention.

One general class of embodiments provides a composition comprising a population of nanostructures, which population displays a photoluminescence quantum yield of 65% or greater, wherein the member nanostructures comprise InP. Optionally, the member nanostructures are substantially free of Ga. The population can display a photoluminescence quantum yield of 70% or greater, 75% or greater, 80% or greater, 85% or greater, or even 90% or greater. For example, the quantum yield can be between 75% and 95%, e.g., between 80% and 95% or between 85% and 95%.

The photoluminescence spectrum of the nanostructures can cover essentially any desired portion of the spectrum, particularly the visible spectrum. For example, the nanostructures can emit in the red, orange, yellow, green, blue, indigo, and/or violet range. Optionally, the photoluminescence spectrum of the population has an emission maximum between 450 nm and 750 nm, for example, between 500 nm and 650 nm. In one class of embodiments, the photoluminescence spectrum of the population has an emission maximum between 500 nm and 560 nm, e.g., between 500 nm and 540 nm (e.g., in the green portion of the spectrum). In one class of embodiments, the photoluminescence spectrum of the population has an emission maximum between 600 nm and 650 nm (e.g., in the red portion of the spectrum).

The size distribution of the nanostructures can be relatively narrow. Thus, the photoluminescence spectrum of the population can have a full width at half maximum of 60 nm or less, e.g., 50 nm or less, 45 nm or less, or even 40 nm or less or 35 nm or less.

The nanostructures optionally include at least one shell. In one aspect, the nanostructures are quantum dots, e.g., quantum dots with an InP core and one or more shells. In one class of embodiments, the nanostructures are InP/ZnS$_x$Se$_{1-x}$/ZnS core/shell quantum dots, where 0<x<1, e.g., where 0.25≤x≤0.75 or where x is about 0.5. In one class of embodiments, the ZnS$_x$Se$_{1-x}$ layer of the shell is between about 0.3 and about 1.0 monolayer of ZnS$_x$Se$_{1-x}$ thick, e.g., about 0.5 monolayer of ZnS$_x$Se$_{1-x}$ thick. In one class of embodiments, the ZnS layer of the shell is between about 1.0 and about 3.0 monolayers of ZnS thick, e.g., about 2.0 monolayers of ZnS thick or about 2.8-3 monolayers thick.

The nanostructures can be of essentially any desired size. For example, the nanostructures can be InP/ZnS$_x$Se$_{1-x}$/ZnS core/shell quantum dots where the InP cores have an average diameter between about 15 Å and about 20 Å, e.g., where green emission is desired. As another example, the nanostructures can be InP/ZnS$_x$Se$_{1-x}$/ZnS core/shell quantum dots where the InP cores have an average diameter between about 25 Å and about 30 Å, e.g., where red emission is desired. The average diameter of the quantum dots can be between about 30 Å and about 36 Å or between about 40 Å and about 46 Å, again for green and red dots, respectively. Optionally, the average diameter of the quantum dots is between about 1.5 nm and about 10 nm (e.g., between about 1.5 nm and about 8 nm or between about 1.8 nm and about 7.5 nm) and/or the cores have an average diameter between about 1 nm and about 5 nm.

The composition optionally includes one or more nanostructure ligands, e.g., those described herein and/or those known in the art. Thus, in one class of embodiments, the composition includes a C5-C8 carboxylic acid ligand bound to the nanostructures. The carboxylic acid can be branched (e.g., having a one carbon branch) or, more preferably, unbranched. Optionally, the carboxylic acid is an unbranched monocarboxylic acid. The carboxylic acid can be saturated or unsaturated.

Thus, in one class of embodiments, the ligand is an alkyl carboxylic acid, preferably an unbranched alkyl carboxylic acid such as pentanoic acid, hexanoic acid, heptanoic acid, or octanoic (caprylic) acid. In other embodiments, the ligand is an alkenyl carboxylic acid or an alkynyl carboxylic acid, for example, 4-pentenoic acid. In one class of embodiments, the composition includes a fatty acid ligand (e.g., lauric, caproic, myristic, palmitic, stearic, or oleic acid).

In one class of embodiments, the composition includes a dicarboxylic or polycarboxylic acid ligand bound to the nanostructures, e.g., dodecenyl succinic acid. Optionally, the composition includes a C5-C8 carboxylic acid ligand (e.g., one of those described above) and a dicarboxylic or polycarboxylic acid ligand; a fatty acid ligand is optionally also included. A large number of other suitable ligands are known in the art; see, e.g., the dicarboxylic acid, polycarboxylic acid, dicarbinol, alcohol, amine, polymeric silicone, and/or organic polymeric ligands described in US patent application publications 2010/0276638 and 2007/0034833, the amine functional polystyrene ligands and polyethyleneimine or modified polyethyleneimine ligands described in US patent application publication 2012/0113672, the silsesquioxane ligands (including polyhedral oligomeric silsesquioxane and/or carboxylic acid ligands) described in U.S. Pat. Nos. 7,267,875 and 7,585,564 and US patent application publication 2008/0118755, the carboxylic acid siloxane polymer ligands as described in U.S. patent application Ser. No. 13/803,596, and the alkylamine siloxane polymer ligands described in U.S. provisional patent application 61/663,234 and U.S. patent application Ser. No. 13/803,596.

The population of nanostructures is optionally embedded in a matrix (e.g., an organic polymer, silicon-containing polymer, inorganic, glassy, and/or other matrix). In one class of embodiments, the population of nanostructures is incorporated into a device, for example, an LED, backlighting unit, downlight, or other display or lighting unit or an optical filter. As noted above, exemplary matrices and devices are known in the art. Also as noted above, the nanostructures can be covalently or noncovalently bound to a biomolecule.

EXAMPLES

The following sets forth a series of experiments that demonstrate growth of highly luminescent nanostructures, including indium enrichment of InP cores, synthesis of a two layer ZnSSe/ZnS shell in two steps using a short chain carboxylic acid ligand, and post-synthesis ligand exchange.

It is understood that the examples and embodiments described herein are for illustrative purposes only and that various modifications or changes in light thereof will be suggested to persons skilled in the art and are to be included within the spirit and purview of this application and scope of the appended claims. Accordingly, the following examples are offered to illustrate, but not to limit, the claimed invention.

Example 1

Synthesis of Highly Luminescent Quantum Dots

Synthesis of INP core for green-emitting core/shell dots

To produce the InP cores, 5 g of trioctylphosphine oxide (TOPO), 2.33 g of indium acetate (8 mmol), and 4.797 g of lauric acid (24 mmol) are added to a reaction flask. The mixture is heated to 160° C. for 40 minutes and then 250° C. for 20 minutes under vacuum. The reaction temperature is then increased to 300° C. under $N_2$ flow. At this temperature, 1 g tris(trimethylsilyl)phosphine (4 mmol) in 3 g trioctylphosphine (TOP) is quickly injected into the reaction flask, and reaction temperature is kept at 260° C. After one minute, the reaction is stopped by removing the heating element, and the reaction solution is allowed to cool to room temperature. 8 ml toluene is added to the reaction mixture in the glove box, and the InP clots are precipitated out by addition of 25 ml ethanol to the mixture followed by centrifugation and decantation of the supernatant. The InP dots obtained are then dissolved in hexane. The dot concentration is determined by UV-Vis absorption measurement based on the bulk InP extinction coefficient at 350 nm.

For additional details on core synthesis, see Example 7 of US patent application publication 2010/0276638.

Indium Laurate Precursor Preparation

To produce an indium laurate precursor for indium core enrichment, 10 g of 1-octadecene (ODE), 146 mg indium acetate (0.5 mmol), and 300 mg lauric acid (1.5 mmol) are added to a reaction flask. The mixture is heated to 140° C. for 2 hours under vacuum to obtain a clear solution. This precursor solution is kept in a glove box at room temperature until needed. The indium laurate precipitates due to low solubility at room temperature; a desired amount of the indium laurate in ODE mixture is heated to about 90° C. to form a clear solution and then the desired amount of the precursor solution is measured out when needed.

Indium Enrichment and Shelling Process for Green-Emitting Dots

To achieve indium core enrichment, 25 mg InP cores in solution in hexane, 6 ml ODE, and 0.5 g of indium laurate in ODE (from the previous step) are added to a reaction flask. The mixture is put under vacuum for 10 minutes at room temperature. The temperature is then increased to 230° C. and held at that temperature for 2 hours.

The reaction temperature is then lowered to 140° C., and 0.7 g hexanoic acid is added to the reaction flask, which is held at 140° C. for 10 minutes.

A 0.5 monolayer thick ZnSSe shell is formed by drop-wise addition of 21 mg diethyl zinc, 13 mg bis(trimethylsilyl)selenide, and 10 mg hexamethyldisilthiane in 1 ml ODE to the reaction mixture. After ZnSSe precursor addition, the reaction temperature is held at 140° C. for 30 minutes.

A 2 monolayer thick ZnS shell is then formed by drop-wise addition of 110 mg diethyl zinc and 106 mg hexamethyldisilthiane in 2 ml ODE to the reaction mixture. Ten minutes after the ZnS precursor addition, the reaction is stopped by removing the heating element.

Synthesis of InP Core for Red-Emitting Core/Shell Dots

To produce the InP cores, 5 g of trioctylphosphine oxide (TOPO), 1.46 g of indium acetate (5 mmol), and 3.16 g of lauric acid (15.8 mmol) are added to a reaction flask. The mixture is heated to 160° C. for 40 minutes under nitrogen, and then 250° C. for 20 minutes under vacuum. The reaction temperature is then increased to 300° C. under $N_2$ flow. At this temperature, 0.25 g tris(trimethylsilyl)phosphine mmol) in 3 g 1-octadecene (ODE) is quickly injected into the reaction flask, and reaction temperature is kept at 260° C. After 5 minutes, the reaction is stopped by removing the heating element, and the reaction solution is allowed to cool to room temperature. 8 ml toluene is added to the reaction mixture in the glove box, and the InP dots are precipitated out by addition of 20 ml ethanol to the mixture followed by centrifugation and decantation of the supernatant. The InP dots obtained are then dissolved in hexane. The dot concentration is determined by UV-Vis absorption measurement based on the bulk InP extinction coefficient at 350 nm.

Indium Enrichment and Shelling Process for Red-Emitting Dots

To achieve indium core enrichment, 25 mg InP cores in hexane solution and 5 g indium laurate in ODE (from the step entitled "Indium Laurate Precursor Preparation") are added to a reaction flask. The mixture is put under vacuum for 10 minutes at room temperature. The temperature is then increased to 230° C. and held at that temperature for 2 hours.

The reaction temperature is then lowered to room temperature, 0.7 g hexanoic acid is added to the reaction flask, and the temperature is increased to 80° C.

A 0.5 monolayer thick ZnSSe shell is formed by drop-wise addition of 14 mg diethyl zinc, 8 mg bis(trimethylsilyl)selenide, and 7 mg hexamethyldisilthiane in 1 ml ODE to the reaction mixture. After ZnSSe precursor addition, the reaction temperature is held at 80° C. for 10 minutes and then the temperature is increased to 140° C. and held for 30 minutes.

A 2 monolayer thick ZnS shell is then formed by drop-wise addition of 69 mg diethyl zinc and 66 mg hexamethyldisilthiane in 2 mL ODE to the reaction mixture. 10 minutes after the ZnS precursor addition, the reaction is stopped by removing the heating element.

DDSA Ligand Exchange Procedure for InP/ZnSeS/ZnS Dots (Green-Emitting or Red-Emitting)

After the shelling reaction, the reaction mixture is allowed to cool down to room temperature. White precipitate is removed by centrifugation, resulting in a clear solution of dots in ODE. 30-50 mg DDSA (dodecenyl succinic acid) is added to 1 ml dot solution and heated for 3 to 15 hours at 90° C. After ligand exchange, the dots are precipitated by adding 6 ml ethanol to 1 ml dot solution, followed by centrifugation, decantation of the supernatant, and drying under vacuum. The dried dots are dissolved in hexane for quantum yield measurement.

Quantum Yield Measurement

On the basis of following equation, relative quantum yield of quantum dots is calculated using fluorescein dye as a reference for green-emitting dots at the 440 nm excitation wavelength and rhodamine 640 as a reference for red-emitting dots at the 540 nm excitation wavelength:

$$\Phi_X = \Phi_{ST}\left(\frac{Grad_X}{Grad_{ST}}\right)\left(\frac{\eta_X^2}{\eta_{ST}^2}\right).$$

The subscripts ST and X denote the standard (reference dye) and the quantum dot solution (test sample), respectively. $\Phi x$ is the quantum yield of the dots, and $\Phi_{ST}$ is the quantum yield of the reference dye. Grad=(I/A), I is the area under the emission peak (wavelength scale); A is the absorbance at excitation wavelength. η is the refractive index of dye or nanostructure in the solvent. See, e.g., Williams et al. (1983) "Relative fluorescence quantum yields using a computer controlled luminescence spectrometer" Analyst 108:1067.

Characterization of InP/ZnSSe/ZnS Quantum Dots

Figure 1B:
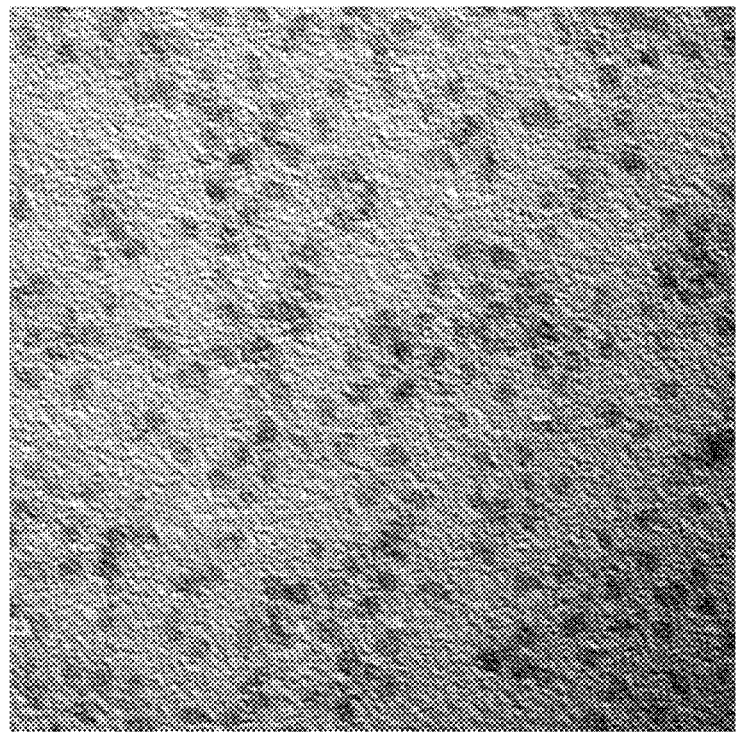
Figure 2A:
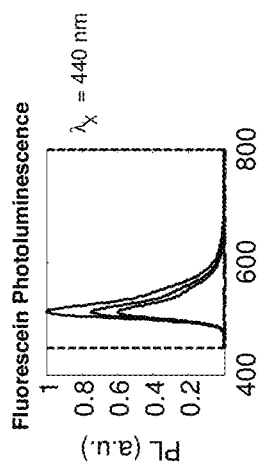
FIG. 2 illustrates optical characterization of green-emitting InP/ZnSSe/S quantum dots. Panel A presents quantum yield measurement based on fluorescein dye (fluorescein upper line, dots lower line). Panel B presents absorption spectra of fluorescein dye. Panel C presents photoluminescence spectra of fluorescein dye. Panel D presents absorption spectra of InP/ZnSSe/S dots. Panel E presents photoluminescence spectra of InP/ZnSSe/S dots.
Figure 2B:
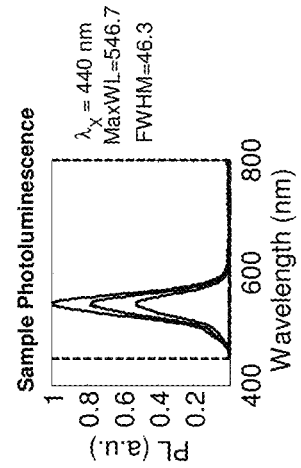
Figure 2C:
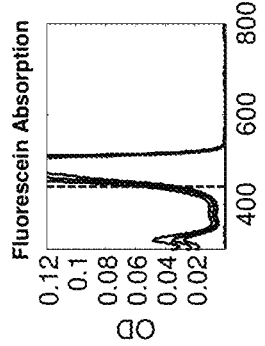
Figure 2D:
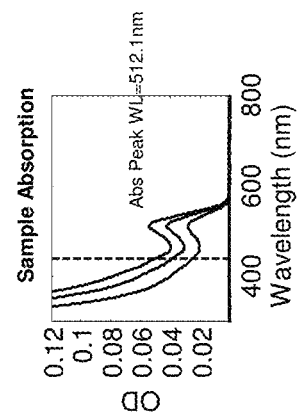
Figure 2E:
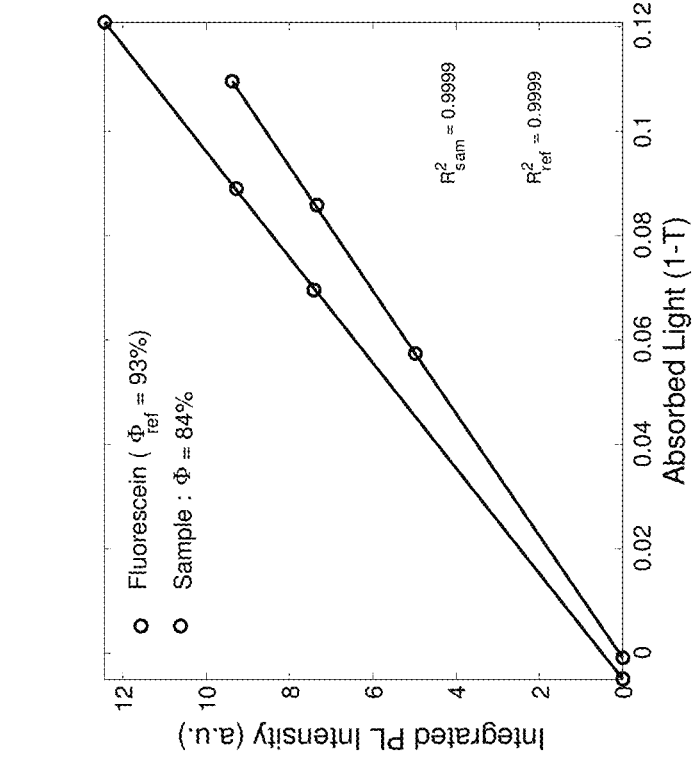

FIG. 1 Panels A and B show TEM images of InP/ZnSSe/ZnS quantum dots synthesized basically as described above.

Optical characterization of green-emitting InP/ZnSSe/S quantum dots produced basically as described above is illustrated in FIG. 2. Panels B and C present absorption and photoluminescence spectra of fluorescein dye. Panels D and E present absorption and photoluminescence spectra of InP/ZnSSe/S quantum dots. Panel A illustrates measurement of quantum yield of the dots based on fluorescein.

Optical characterization of red-emitting InP/ZnSSe/S quantum dots produced basically as described above is illustrated in FIG. 3. Panels B and C present absorption and photoluminescence spectra of rhodamine 640 dye. Panels D and E present absorption and photoluminescence spectra of InP/ZnSSe/S quantum dots. Panel A illustrates measurement of quantum yield of the dots based on rhodamine 640.

Representative optical data for red- and green-emitting quantum dots produced basically as described above are presented in Table 1.

TABLE 1

Representative optical data for green- and red-emitting InP/ZnSeS/ZnS quantum dots.

| Emission maximum wavelength, nm | Quantum yield, % | Full width at half maximum, nm |
|---|---|---|
| 525 | 75 | 40 |
| 546 | 85 | 50 |
| 636 | 65 | 45 |

Example 2

Zinc Sulfide Shell Formation Using an Organic Thiol Sulfur Precursor

Green-emitting InP cores are synthesized as described above. To achieve indium core enrichment, 25 mg InP cores in solution in hexane, 6 ml ODE, and 0.5 g of indium laurate in ODE (prepared as detailed above) are added to a reaction flask. The mixture is put under vacuum for 10 minutes at room temperature. The temperature is then increased to 230° C. and held at that temperature for 2 hours.

The reaction temperature is then lowered to 140° C., and 0.7 g hexanoic acid is added to the reaction flask, which is held at 140° C. for 10 minutes. A 0.5 monolayer thick ZnSSe shell is formed by drop-wise addition of 21 mg diethyl zinc, 13 mg bis(trimethylsilyl)selenide, and 10 mg hexamethyldisilthiane in 1 ml ODE to the reaction mixture over 2 min. After ZnSSe precursor addition, the reaction temperature is held at 140° C. for 30 minutes. The temperature is then increased to 200° C. A two monolayer thick ZnS shell is then formed by drop-wise addition of 110 mg diethyl zinc and 120 mg 1-dodecanethiol in 4 ml ODE to the reaction mixture over 40 min by syringe pump. Ten minutes after the ZnS precursor addition, the reaction is stopped by removing the heating element. DDSA ligand exchange is performed as described above.

Representative optical data for green-emitting quantum dots produced basically as described above are presented in Table 2.

TABLE 2

Representative optical data for green-emitting InP/ZnSeS/ZnS quantum dots.

| Emission maximum wavelength, nm | Quantum yield, % | Full width at half maximum, nm |
|---|---|---|
| 527 | 74 | 41 |

While the foregoing invention has been described in some detail for purposes of clarity and understanding, it will be clear to one skilled in the art from a reading of this disclosure that various changes in form and detail can be made without departing from the true scope of the invention. For example, all the techniques and apparatus described above can be used in various combinations. All publications, patents, patent applications, and/or other documents cited in this application are incorporated by reference in their entirety for all purposes to the same extent as if each individual publication, patent, patent application, and/or other document were individually indicated to be incorporated by reference for all purposes.

What is claimed is:

1. A composition comprising: a nanostructure; and a C5-C8 carboxylic acid ligand bound to a surface of the nanostructure, wherein the nanostructure is an InP/ZnS$_x$Se$_{1-x}$/ZnS core/shell quantum dot, where $0 \leq x \leq 1$.

2. The composition of claim 1, wherein $0.25 \leq x \leq 0.75$.

3. The composition of claim 2, wherein x is about 0.5.

4. The composition of claim 2, wherein the ligand is hexanoic acid.

5. The composition of claim 4, further comprising a dicarboxylic or polycarboxylic acid ligand bound to the surface of the nanostructure, wherein the dicarboxylic or polycarboxylic acid ligand is dodecenyl succinic acid.

6. The composition of claim 1, wherein the nanostructure is embedded in a matrix.

7. A device comprising the composition of claim 1.

8. The composition of claim 1, wherein the ligand is an alkyl carboxylic acid.

9. The composition of claim 1, wherein the ligand is an unbranched alkyl carboxylic acid.

10. The composition of claim 1, wherein the ligand is hexanoic acid.

11. The composition of claim 1, wherein the ligand is pentanoic acid.

12. The composition of claim 1, wherein the ligand is an alkenyl carboxylic acid or an alkynyl carboxylic acid.

13. The composition of claim 1, wherein the ligand is 4-pentanoic acid.

14. The composition of claim 1, wherein the ligand is an unbranched monocarboxylic acid.

15. The composition of claim 1, further comprising a dicarboxylic or polycarboxylic acid ligand bound to the surface of the nanostructure.

16. The composition of claim 15, wherein the dicarboxylic or polycarboxylic acid ligand is dodecenyl succinic acid.

17. The composition of claim 1, further comprising a long chain fatty acid ligand bound to the surface of the nanostructure, which long chain fatty acid comprises at least 12 carbon atoms.

* * * * *